(12) United States Patent
Chang

(10) Patent No.: US 12,519,026 B2
(45) Date of Patent: Jan. 6, 2026

(54) SEMICONDUCTOR STRUCTURE WITH CAPPING MEMBER CONTAINING OXYNITRIDE LAYER AND METHOD OF MANUFACTURING THEREOF

(71) Applicant: TAIWAN SEMICONDUCTOR MANUFACTURING COMPANY LTD., Hsinchu (TW)

(72) Inventor: Jen-Yuan Chang, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 553 days.

(21) Appl. No.: 17/813,956

(22) Filed: Jul. 21, 2022

(65) Prior Publication Data
US 2024/0030082 A1    Jan. 25, 2024

(51) Int. Cl.
| | |
|---|---|
| *H01L 23/31* | (2006.01) |
| *H01L 21/56* | (2006.01) |
| *H01L 23/00* | (2006.01) |
| *H01L 23/29* | (2006.01) |
| *H01L 23/522* | (2006.01) |

(52) U.S. Cl.
CPC ........ *H01L 23/3192* (2013.01); *H01L 21/568* (2013.01); *H01L 23/291* (2013.01); *H01L 23/5226* (2013.01); *H01L 24/08* (2013.01); *H01L 24/05* (2013.01); *H01L 24/13* (2013.01); *H01L 24/80* (2013.01); *H01L 2224/05639* (2013.01); *H01L 2224/05647* (2013.01); *H01L 2224/08145* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/80379* (2013.01); *H01L 2924/05442* (2013.01)

(58) Field of Classification Search
CPC . H01L 21/568; H01L 23/3192; H01L 23/291; H01L 23/5226; H01L 24/08; H01L 24/05; H01L 24/13; H01L 24/80
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |

(Continued)

FOREIGN PATENT DOCUMENTS

CN    111799185 A  * 10/2020  ......... H01L 23/3135

*Primary Examiner* — Fernando L Toledo
*Assistant Examiner* — Ryan T. Fortin
(74) *Attorney, Agent, or Firm* — WPAT LAW; Anthony King

(57) ABSTRACT

The semiconductor structure includes a die structure including: a substrate, a first dielectric disposed over the substrate, a first interconnect structure disposed within the first dielectric, a second dielectric disposed on the first dielectric, and a conductive pad surrounded by the second dielectric; a capping member surrounding the die structure; and an insulating member surrounding the capping member, wherein the capping member includes a first oxynitride layer in contact with the die structure or the insulating member.

20 Claims, 21 Drawing Sheets

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2008/0142990 A1* | 6/2008 | Yu | H01L 25/0657 |
| | | | 438/109 |
| 2019/0139847 A1* | 5/2019 | Wang | H01L 23/3135 |
| 2020/0075537 A1* | 3/2020 | Luo | H01L 25/0652 |
| 2021/0066252 A1* | 3/2021 | Chen | H01L 24/13 |
| 2022/0013494 A1* | 1/2022 | Huang | H01L 23/3677 |
| 2023/0110531 A1* | 4/2023 | Shih | H01L 23/3171 |
| | | | 438/106 |
| 2023/0113020 A1* | 4/2023 | Shih | H01L 21/561 |
| | | | 257/787 |

* cited by examiner

SEMICONDUCTOR STRUCTURE WITH CAPPING MEMBER CONTAINING OXYNITRIDE LAYER AND METHOD OF MANUFACTURING THEREOF

BACKGROUND

The semiconductor industry has experienced rapid growth due to ongoing improvements in the integration density of a variety of electrical components. To accommodate the miniaturized scale of the semiconductor device, various technologies and applications have been developed for the wafer-level packaging, involving greater numbers of different components with different functions. Improvement in integration density has resulted from iterative reduction of minimum feature size, which allows more components to be integrated into a given area.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
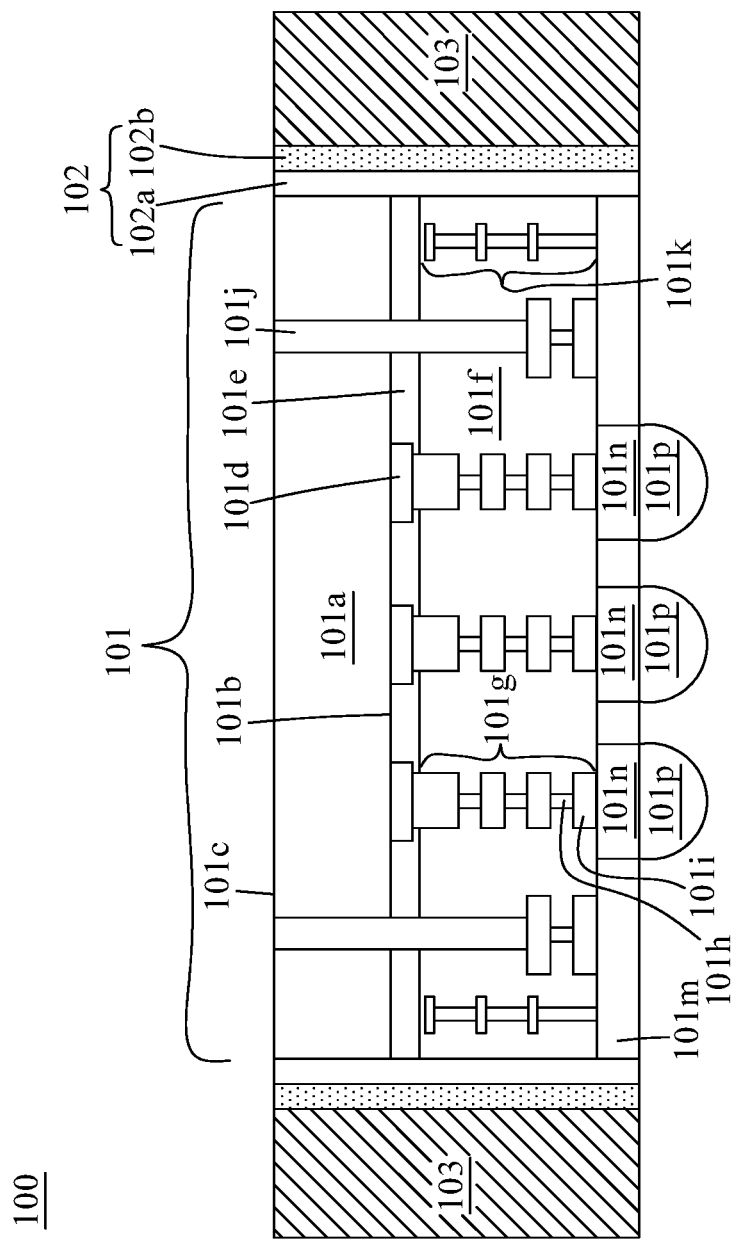
FIG. 1 is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the present disclosure, a semiconductor structure and a method of manufacturing a semiconductor structure are provided. The semiconductor structure includes a die structure surrounded by a capping member including an oxynitride layer. Other features and processes may also be included. In some embodiments, the method of manufacturing the semiconductor structure includes forming a capping member including an oxynitride layer to surround a die structure. As a result, development of cracks can be minimized or prevented. The overall strength of the semiconductor structure can be increased or improved.

Figure 2:
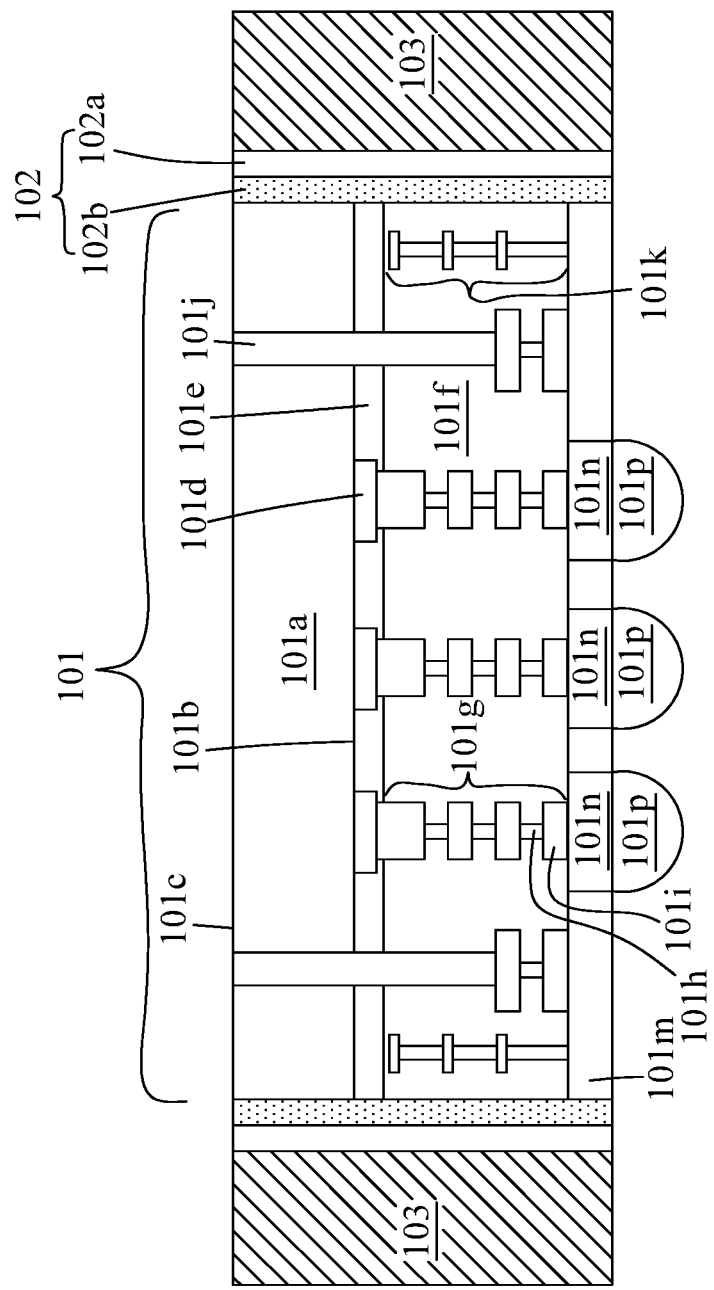
FIG. 2 is a cross-sectional view of a semiconductor structure in accordance with another embodiment of the present disclosure.

FIG. 1 is a schematic cross-sectional view of a first semiconductor structure 100 in accordance with some embodiments of the present disclosure. FIG. 2 is a schematic cross-sectional view of another embodiment of the first semiconductor structure 100. In some embodiments, the first semiconductor structure 100 includes a die structure 101, a capping member 102, and an insulating member 103. The first semiconductor structure 100 is a chip, a package or a part of the chip or the package. In some embodiments, the die structure 101 is a die, a chip or a package. In some embodiments, the die structure 101 is a logic die, a central processing unit (CPU) die, a micro control unit (MCU) die, an input-output (IO) die, an application processor (AP) die, or the like. The die structure 101 includes a substrate 101$a$, a die pad 101$d$, a passivation 101$e$, a first dielectric 101$f$, a interconnect structure 101$g$, a second dielectric 101$m$, a conductive pad 101$n$, and a conductive bump 101$p$. The die structure 101 is surrounded by the capping member 102 and the insulating member 103.

The substrate 101$a$ includes semiconductive material such as silicon, germanium, gallium, arsenic, or a combination thereof. In some embodiments, the substrate 101$a$ is a semiconductor wafer. In some embodiments, the substrate 101$a$ is a silicon substrate. The substrate 101$a$ includes a first surface 101$b$ and a second surface 101$c$ opposite to the first surface 101$b$. In some embodiments, the first surface 101$b$ is a front side or an active side that several electrical components are disposed thereon. In some embodiments, the second surface 101$c$ is a back side or an inactive side that electrical component disposed thereon is absent.

The die pad 101$d$ is disposed on the substrate 101$a$. In some embodiments, the die pad 101$d$ is disposed on the first surface 101$b$ of the substrate 101$a$. The die pad 101$d$ is configured to receive an external interconnect structure, so that the substrate 101$a$ or the electrical components on or within the substrate 101$a$ can electrically, connect to the external interconnect structure via the die pad 101$d$. The die pad 101$d$ includes conductive material such as aluminum or the like.

The passivation 101$e$ is disposed on the substrate 101$a$ and surrounds the die pad 101$d$. In some embodiments, the passivation 101$e$ is disposed on the first surface 101$b$ of the substrate 101$a$. The die pad 101$d$ is at least partially exposed through the passivation 101$e$. The passivation 101$e$ includes dielectric material such as silicon oxide, silicon nitride, silicon carbide, silicon oxynitride or the like.

The first dielectric 101$f$ is disposed on the passivation 101$e$. In some embodiments, the first dielectric 101$f$ is disposed over the first surface 101$b$ of the substrate 101$a$, The first dielectric 101$f$ includes dielectric material such as polymer, polyimide, polybenzoxazole (PBO) or the like. The interconnect structure 101$g$ is disposed within the first dielectric 101$f$. The interconnect structure 101$g$ is electrical routing within the die structure 101. The interconnect structure 101$g$ is electrically coupled with the die pad 101$d$. The interconnect structure 101$g$ extends from the die pad 101$d$ and away from the substrate 101. The interconnect structure 101$g$ includes conductive material such as copper, silver or the like.

In some embodiments, the interconnect structure 101$g$ includes a via portion 101$h$ and a pad portion 101$i$ coupled with the via portion 101$h$. The via portion 101$h$ extends vertically within the first dielectric 101$f$. The pad portion 101$i$ extends laterally within the first dielectric 101$f$. The pad portion 101$i$ is coupled with the die pad 101$d$. In some embodiments, the interconnect structure 101$g$ includes a via 101$j$ extending partially through the first dielectric 101$g$ and extending through the substrate 101$a$. The via 101$j$ is electrically coupled with the pad portion 101$i$ or the via portion 101$h$. The via 101$j$ is at least partially exposed through the second surface 101$c$ of the substrate 101$a$.

In some embodiments, the interconnect structure 101$g$ includes a seal ring member 101$k$ disposed adjacent to a periphery of the die structure 101. The seal ring member 101$k$ surrounds the via portion 101$h$, the pad portion 101$i$, and the via 101$j$. The seal ring member 101$k$ extends vertically within the first dielectric 101$f$. The seal ring member 101$k$ is a dummy structure and is electrically isolated from the pad portion 101$i$, the via portion 101$h$, the via 101$j$, the die pad 101$d$, and an electrical component in the substrate 101$a$. The seal ring member 101$k$ is connected to an electrical ground.

The second dielectric 101$m$ is disposed on the first dielectric 101$f$. The second dielectric 101$m$ includes dielectric material such as polymer, polyimide, polybenzoxazole (PBO) or the like. In some embodiments, the second dielectric 101$m$ and the first dielectric 101$f$ include same material or different materials. In some embodiments, a conductive pad 101$n$ is disposed on the first dielectric 101$f$ and at least partially exposed through the second dielectric 101$m$. The conductive pad 101$n$ is electrically coupled with the interconnect structure 101$g$. The conductive pad 101$n$ is disposed on the pad portion 101$i$. The conductive pad 101$n$ is configured to receive an external interconnect structure. The conductive pad 101$n$ includes conductive material such as copper, silver or the like. In some embodiments, the conductive pad 101$n$ is an under bump metallurgy (UBM) pad, solder bump pad or the like.

In some embodiments, a conductive bump 101$p$ is disposed on the conductive pad 101$n$ and is protruded from the second dielectric 101$m$. The conductive bump 101$p$ is configured to mount on another die structure and electrically connect with an external interconnect structure or another die structure. In some embodiments, the conductive bump 101$p$ is ball grid array (BGA) balls, controlled collapse chip connection (C4) bumps, microbumps, pillars or the like. The conductive bump 101$p$ includes metals such as lead, tin copper, gold, nickel, etc. or metal alloy such as combination of lead, tin copper, gold, nickel, etc.

The capping member 102 surrounds the die structure 101. The capping member 102 extends along and contacts a sidewall of the die structure 101. The capping member 102 is in contact with the substrate 101a, the passivation 101e, the first dielectric 101f, and the second dielectric 101m. In some embodiments, the capping member 102 is a multilayers structure. The capping member 102 includes dielectric material such as silicon nitride, silicon oxynitride or the like. In some embodiments, a first end surface of the capping member 102 is substantially coplanar with a top surface of the second dielectric 101m, and a second end surface of the capping member 102 is substantially coplanar with the second surface 101c of the substrate 101a.

In some embodiments, the capping member 102 includes a first oxynitride layer 102a in contact with the die structure 101. The first oxynitride layer 102a extends along the sidewall of the die structure 101. The first oxynitride layer 102a includes more than 5% of oxygen. In some embodiments, an oxygen content and a nitride content in the first oxynitride layer 102a are substantially the same. In some embodiments, a ratio of the oxygen to the nitride in the first oxynitride layer 102a is about 1:1. The first oxynitride layer 102a includes silicon oxynitride or the like. In some embodiments, a thickness of the first oxynitride layer 102a is about 50 nm. In some embodiments, the thickness of the first oxynitride layer 102a is about 50 nm to about 80 nm.

In some embodiments, the capping member 102 includes a nitride layer 102b between the insulating member 103 and the first oxynitride layer 102a. The nitride layer 102b is in contact with the insulating member 103 but isolated from the die structure 101. The nitride layer 102b is conformal to the first oxynitride layer 102a. The nitride layer 102b does not include oxygen. In some embodiments, an oxygen content of the first oxynitride layer 102a is substantially greater than an oxygen content of the nitride layer 102b. The nitride layer 102b includes silicon nitride or the like. In some embodiments, a thickness of the nitride layer 102b is substantially greater than the thickness of the first oxynitride layer 102a. In some embodiments, the thickness of the nitride layer 102b is about 75 nm. In some embodiments, the thickness of the nitride layer 102b is about 50 nm to about 80 nm.

Alternatively, in some embodiments as shown in FIG. 2, the first oxynitride layer 102a is in contact with the insulating member 103 but isolated from the die structure 101. The first oxynitride layer 102a extends between the insulating member 103 and the nitride layer 102b. The nitride layer 102b is in contact with the die structure 101. The nitride layer 102b is in contact with the substrate 101a, the passivation 101e, the first dielectric 101f, and the second dielectric 101m.

In some embodiments, the insulating member 103 surrounds the capping member 102. The insulating member 103 is in contact with the nitride layer 102b. Alternatively, in some embodiments as shown in FIG. 2, the insulating member 103 is in contact with the first oxynitride layer 102a. In some embodiments, a thickness of the insulating member 103 is substantially greater than a thickness of the capping member 102. In some embodiments, a first end surface of the insulating member 103 is substantially coplanar with the first end surface of the capping member 102, and a second end surface of the insulating member 103 is substantially coplanar with the second end surface of the capping member 102. The second surface 101c of the substrate 101a is exposed through the capping member 102 and the insulating member 103. The second dielectric 101m is exposed through the capping member 102 and the insulating member 103.

The insulating member 103 includes dielectric material such as oxide or the like. In some embodiments, the insulating member 103 includes silicon dioxide. In some embodiments, an oxygen content of the insulating member 103 is substantially greater than an oxygen content of the capping member 102. The oxygen content of the insulating member 103 is substantially greater than the oxygen content of the first oxynitride layer 102a. The oxygen content of the insulating member 103 is substantially greater than the oxygen content of the nitride layer 102b.

Figure 3:
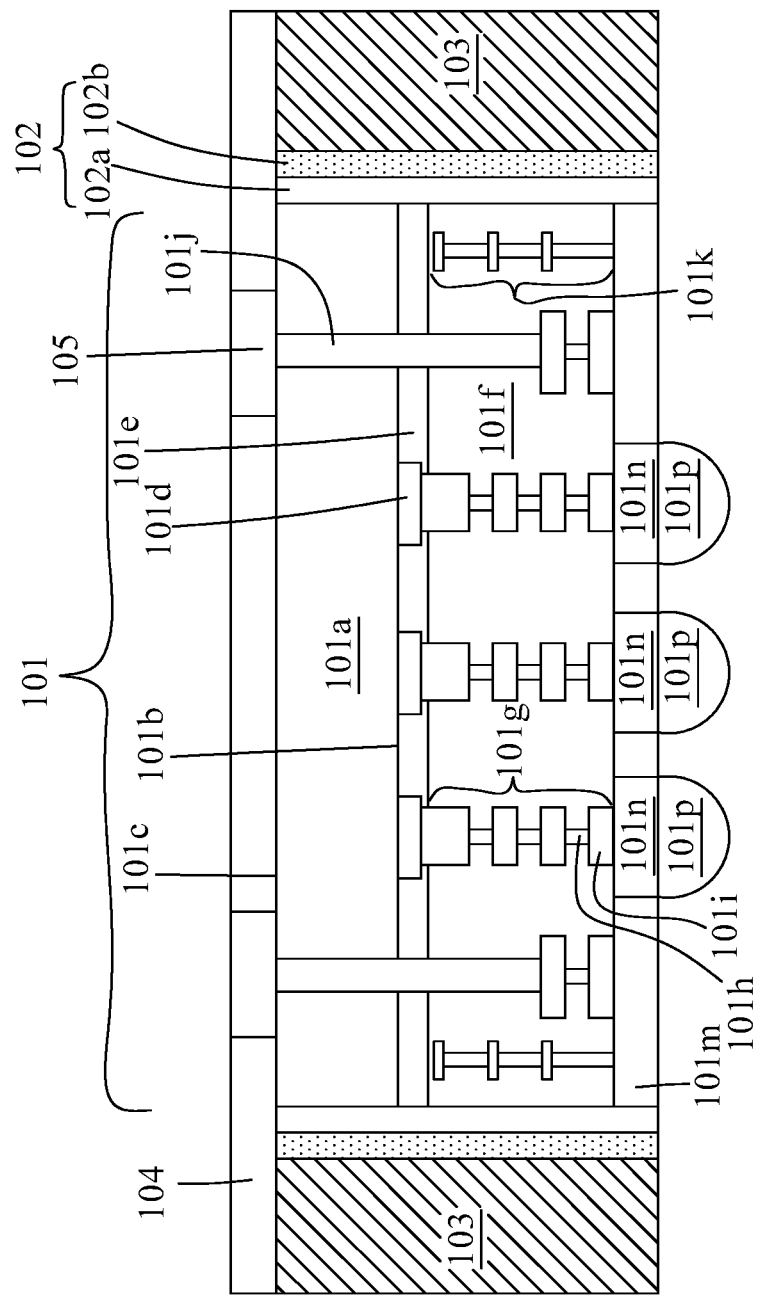
FIG. 3 is a cross-sectional view of a semiconductor structure in accordance with another embodiment of the present disclosure.

In some embodiments as shown in FIG. 3, a bonding dielectric 104 is disposed on the substrate 101a of the die structure 101, the capping member 102 and the insulating member 103. The bonding dielectric 104 is disposed on the second surface 101c of the substrate 101, the second end surface of the capping member 102 and the second end surface of the insulating member 103. The bonding dielectric 104 includes dielectric material such as oxide or the like. In some embodiments, the bonding dielectric 104 includes silicon oxide.

In some embodiments, a bonding pad 105 is disposed on the substrate 101a of the die structure 101 and surrounded by the bonding dielectric 104. The bonding pad 105 is disposed on the second surface 101c of the substrate 101a. The bonding pad 105 is electrically connected with the interconnect structure 101g. The bonding pad 105 is electrically coupled with the via 101j. The bonding pad 105 includes conductive material such as copper, silver or the like.

Figure 4:
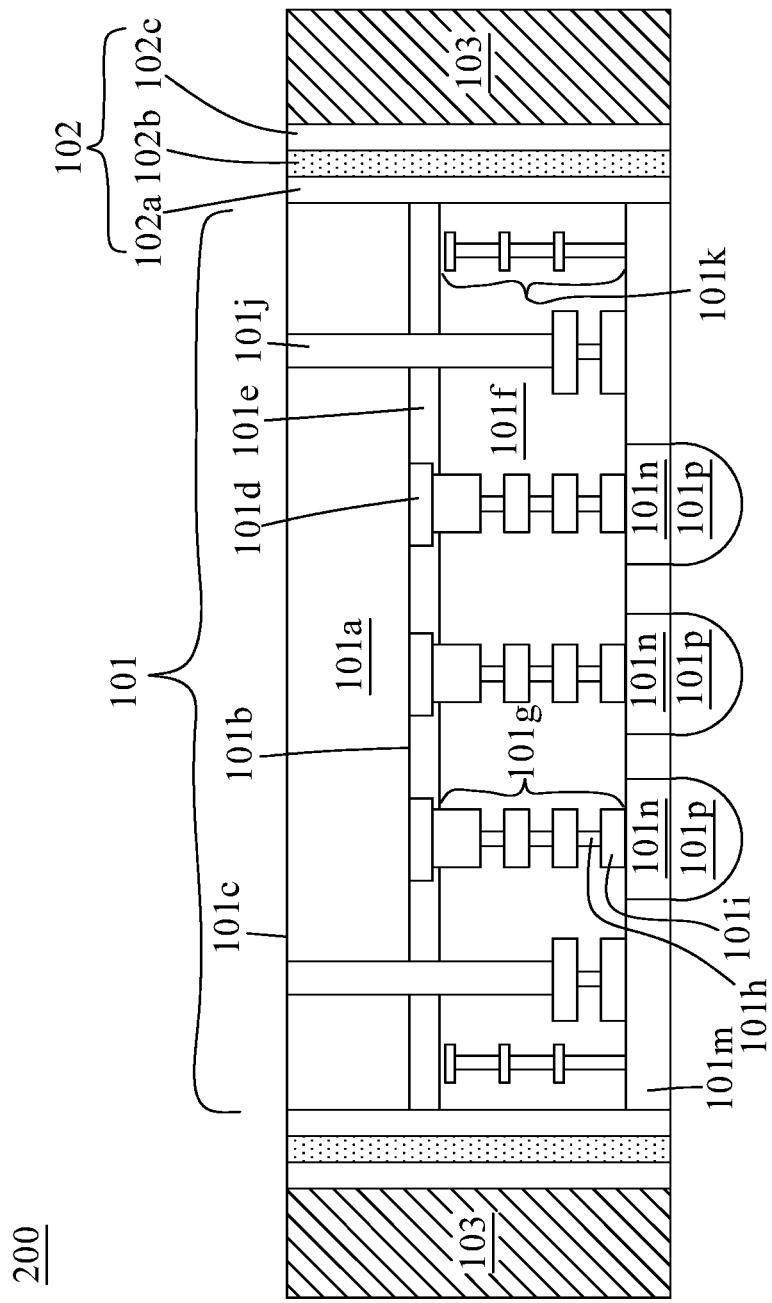
FIG. 4 is a cross-sectional view of a semiconductor structure in accordance with another embodiment of the present disclosure.

FIG. 4 is a schematic cross-sectional view of a second semiconductor structure 200 in accordance with some embodiments of the present disclosure. The second semiconductor structure 200 is similar to the first semiconductor structure 100 of FIG. 1, except the capping member 102 further includes a second oxynitride layer 102c between the nitride layer 102b and the insulating member 103. The second oxynitride layer 102c extends between the nitride layer 102b and the insulating member 103. The nitride layer 102b is between the first oxynitride layer 102a and the second oxynitride layer 102c.

The second oxynitride layer 102c is similar to the first oxynitride layer 102a. The second oxynitride layer 102c includes more than 5% of oxygen. The second oxynitride layer 102c includes silicon oxynitride. The oxygen content of the insulating member 103 is substantially greater than an oxygen content of the second oxynitride layer 102c. The oxygen content of the second oxynitride layer 102c is substantially equal to the oxygen content of the first oxynitride layer 102a. In some embodiments, a thickness of the second oxynitride layer 102c is about 50 nm. In some embodiments, the thickness of the second oxynitride layer 102c is about 50 nm to about 80 nm. The thickness of the second oxynitride layer 102c is substantially equal to the thickness of the first oxynitride layer 102a.

In some embodiments, the capping member 102 is multilayers structure that several oxynitride layers and several nitride layers are alternately arranged. The capping member 102 further includes a second nitride layer. The second nitride layer is in contact with the second oxynitride layer 102c and disposed between the second oxynitride layer 102c and the insulating member 103. The capping member 102 further includes a third oxynitride layer is in contact with the second nitride layer and disposed between the second nitride layer and the insulating member 103.

Figure 5:
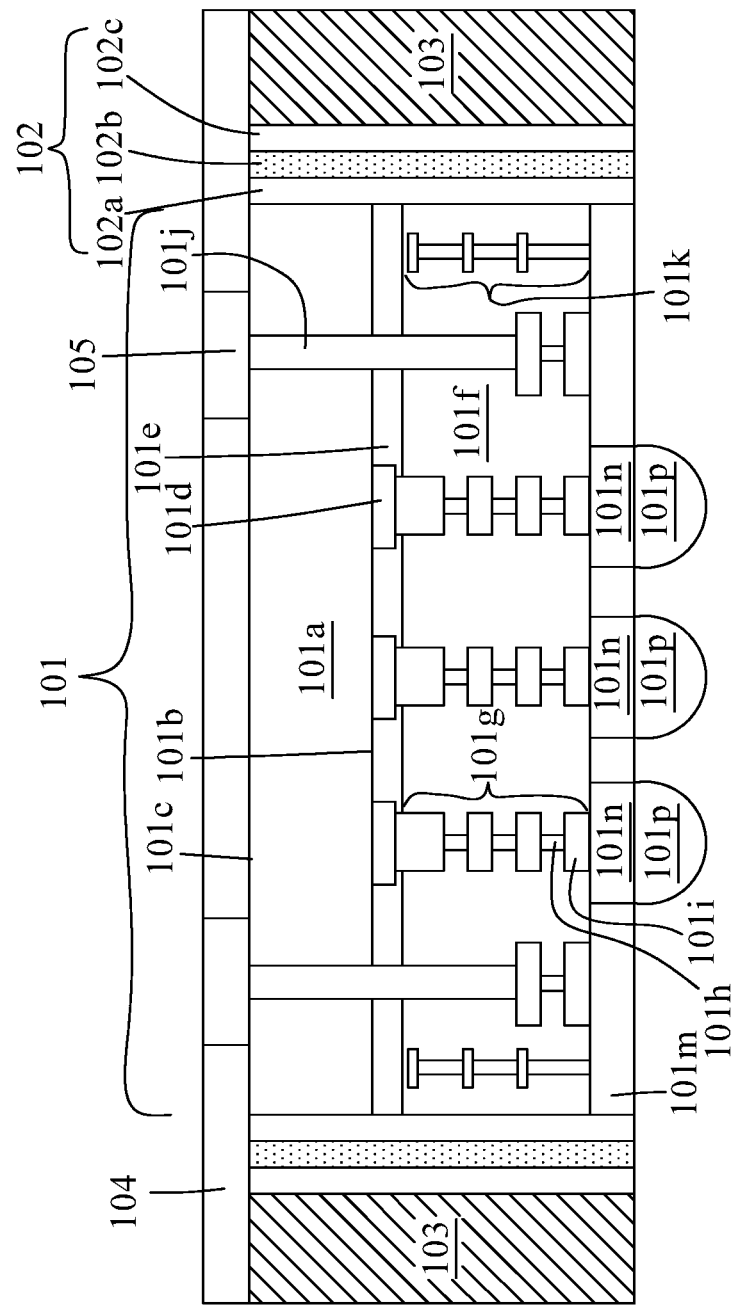
FIG. 5 is a cross-sectional view of a semiconductor structure in accordance with another embodiment of the present disclosure.

In some embodiments as shown in FIG. 5, the bonding dielectric 104 is disposed on the substrate 101a of the die structure 101, the capping member 102, and the insulating member 103. The bonding dielectric 104 is disposed on the second surface 101c of the substrate 101, the second end surface of the capping member 102, and the second end surface of the insulating member 103. The bonding dielectric 104 includes dielectric material such as oxide or the like. In some embodiments, the bonding dielectric 104 includes silicon oxide.

The bonding pad 105 is disposed on the substrate 101a of the die structure 101 and surrounded by the bonding dielectric 104. The bonding pad 105 is disposed on the second surface 101c of the substrate 101a. The bonding pad 105 is electrically connected with the interconnect structure 101g. The bonding pad 105 is electrically coupled with the via 101j. The bonding pad 105 includes conductive material such as copper, silver or the like.

Figure 6:
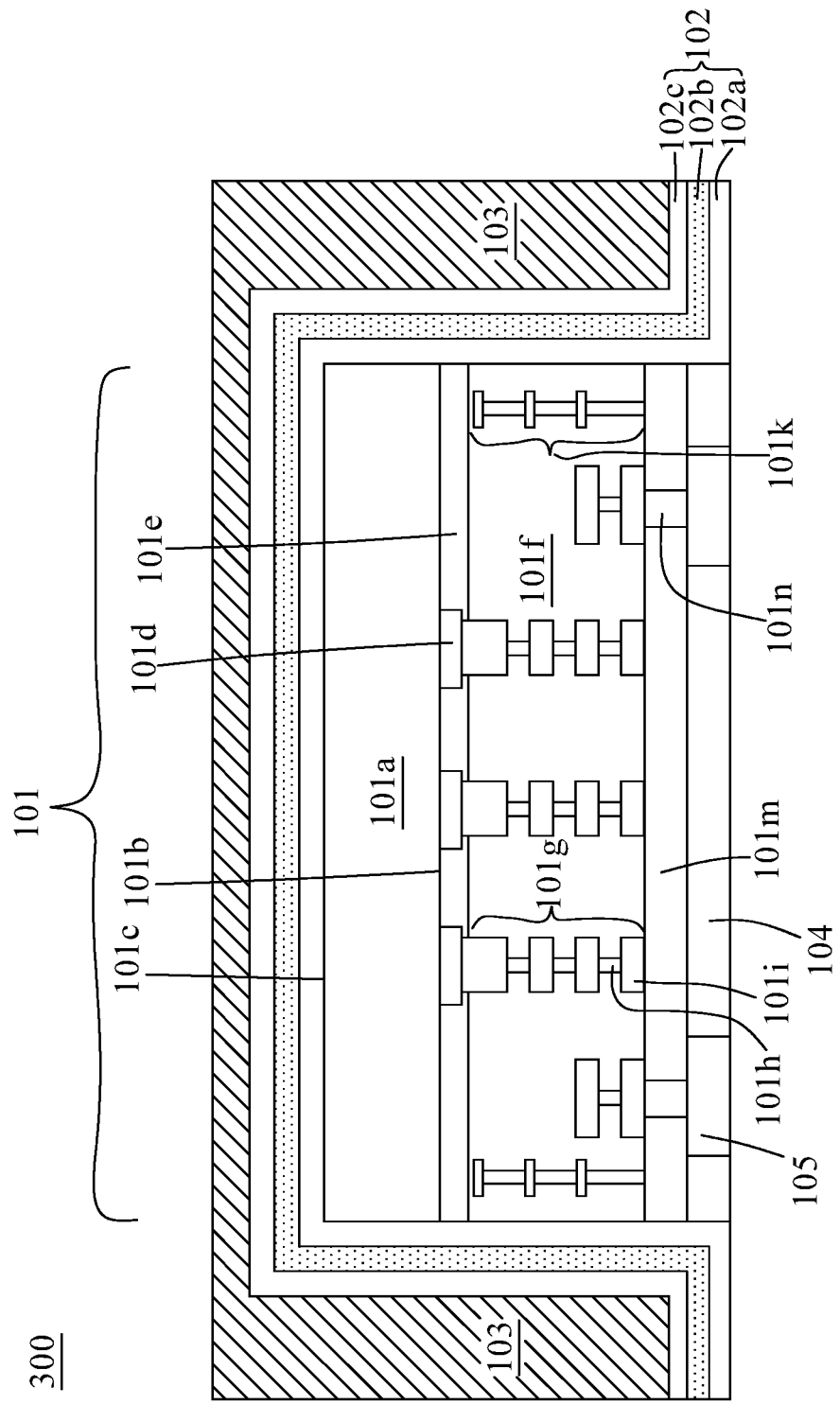
FIG. 6 is a cross-sectional view of a semiconductor structure in accordance with another embodiment of the present disclosure.

FIG. 6 is a schematic cross-sectional view of a third semiconductor structure 300 in accordance with some embodiments of the present disclosure. The third semiconductor structure 300 is similar to the second semiconductor structure 200 of FIG. 4, except configurations of the capping member 102 and the insulating member 103. The capping member 102 covers the entire die structure 101. The capping member 102 is disposed on the second surface 101c of the substrate 101.

The capping member 102 includes a lateral portion surrounding the second dielectric 101m. In some embodiments, a bonding dielectric 104 is disposed on the second dielectric 101m, and a bonding pad 105 is disposed on the second dielectric 101m and surrounded by the bonding dielectric 104. The bonding pad 105 is electrically coupled with the conductive pad 101n surrounded by the second dielectric the. The bonding dielectric 104 and the bonding pad 105 have configurations similar to the bonding dielectric 104 and the bonding pad 105 as shown in FIG. 5 and described above. The lateral portion of the capping member 102 also surrounds the bonding dielectric 104. The insulating member 103 is disposed conformal to the capping member 102. The insulating member 103 is disposed above the second surface 101c of the substrate 101 and the lateral portion of the capping member 102.

Figure 7:
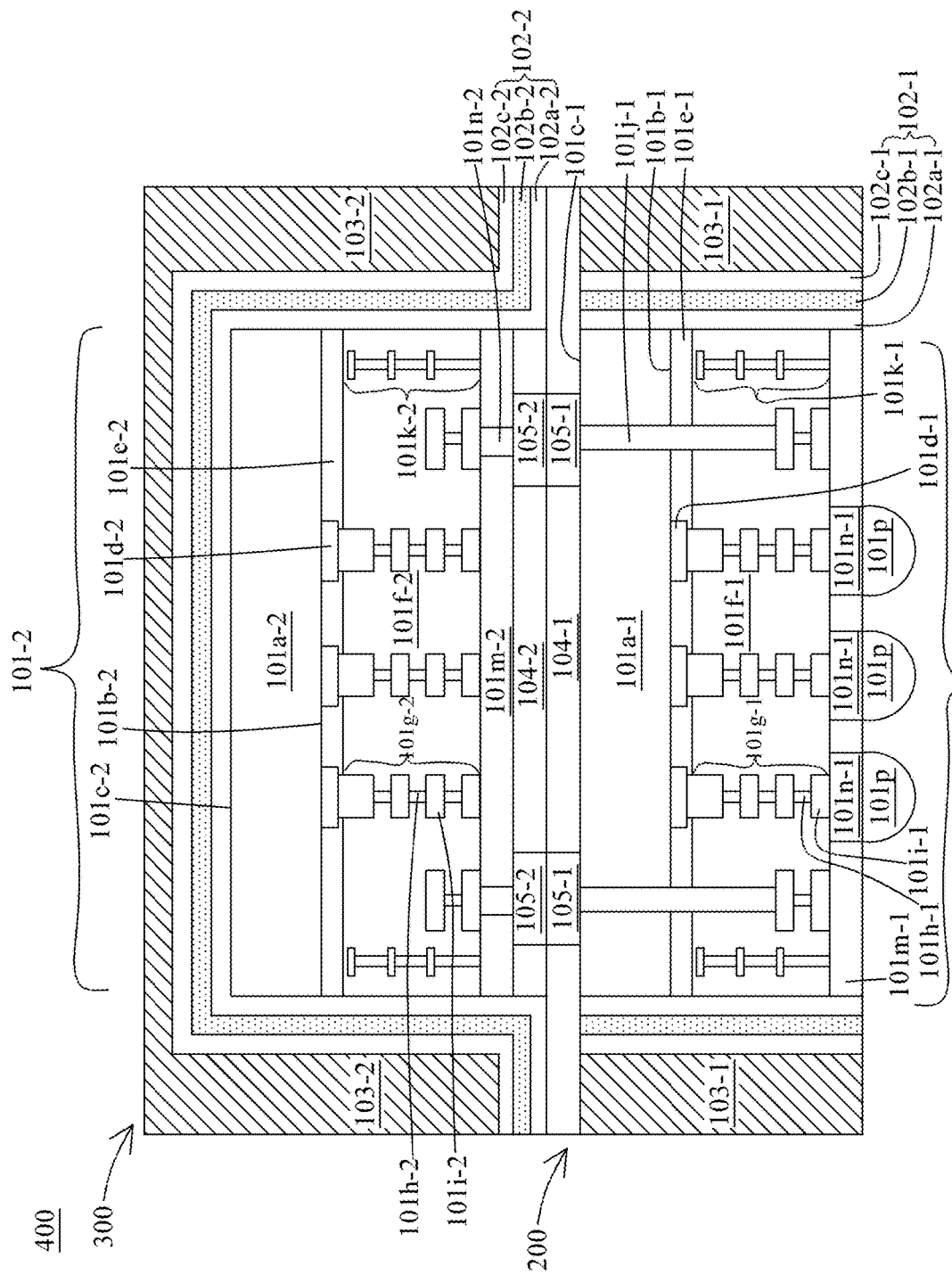
FIG. 7 is a cross-sectional view of a semiconductor structure in accordance with another embodiment of the present disclosure.

FIG. 7 is a schematic cross-sectional view of a fourth semiconductor structure 400 in accordance with some embodiments of the present disclosure. The fourth semiconductor structure 400 includes the second semiconductor structure 200 of FIG. 5 and the third semiconductor structure 300 of FIG. 6 stacked on the second semiconductor structure 200 of FIG. 5. The features of the second semiconductor structure 200 in FIG. 7 are given the same reference characters as those in FIG. 5, but with suffix "-1" added, and the features of the third semiconductor structure 300 in FIG. 7 are given the same reference characters as those in FIG. 6, but with suffix "-2" added. The second semiconductor structure 200 is bonded with the third semiconductor structure 300. In some embodiments, the fourth semiconductor structure 400 is system on integrated circuit (SoIC) structure, chip on wafer on substrate (CoWoS) structure, integrated fan out (InFO) structure or the like. The second semiconductor structure 200 is electrically connected to the third semiconductor structure 300.

The bonding dielectric 104-1 of the second semiconductor structure 200 is bonded with the bonding dielectric 104-2 of the third semiconductor structure 300, and the bonding pad 105-1 of the second semiconductor structure 200 is bonded with the bonding pad 105-2 of the third semiconductor structure 300. The interconnect structure 101g-1 of the second semiconductor structure 200 is electrically connected to the interconnect structure 101g-2 of the third semiconductor structure 300. The capping member 102-2 of the third semiconductor structure 300 is in contact with the bonding dielectric 104-1 of the second semiconductor structure 200. In some embodiments, at least a portion of the capping member 102-2 of the third semiconductor structure 300 is disposed between the insulating member 103-1 of the second semiconductor structure 200 and the insulating member 103-2 of the third semiconductor structure 300.

Figure 8:
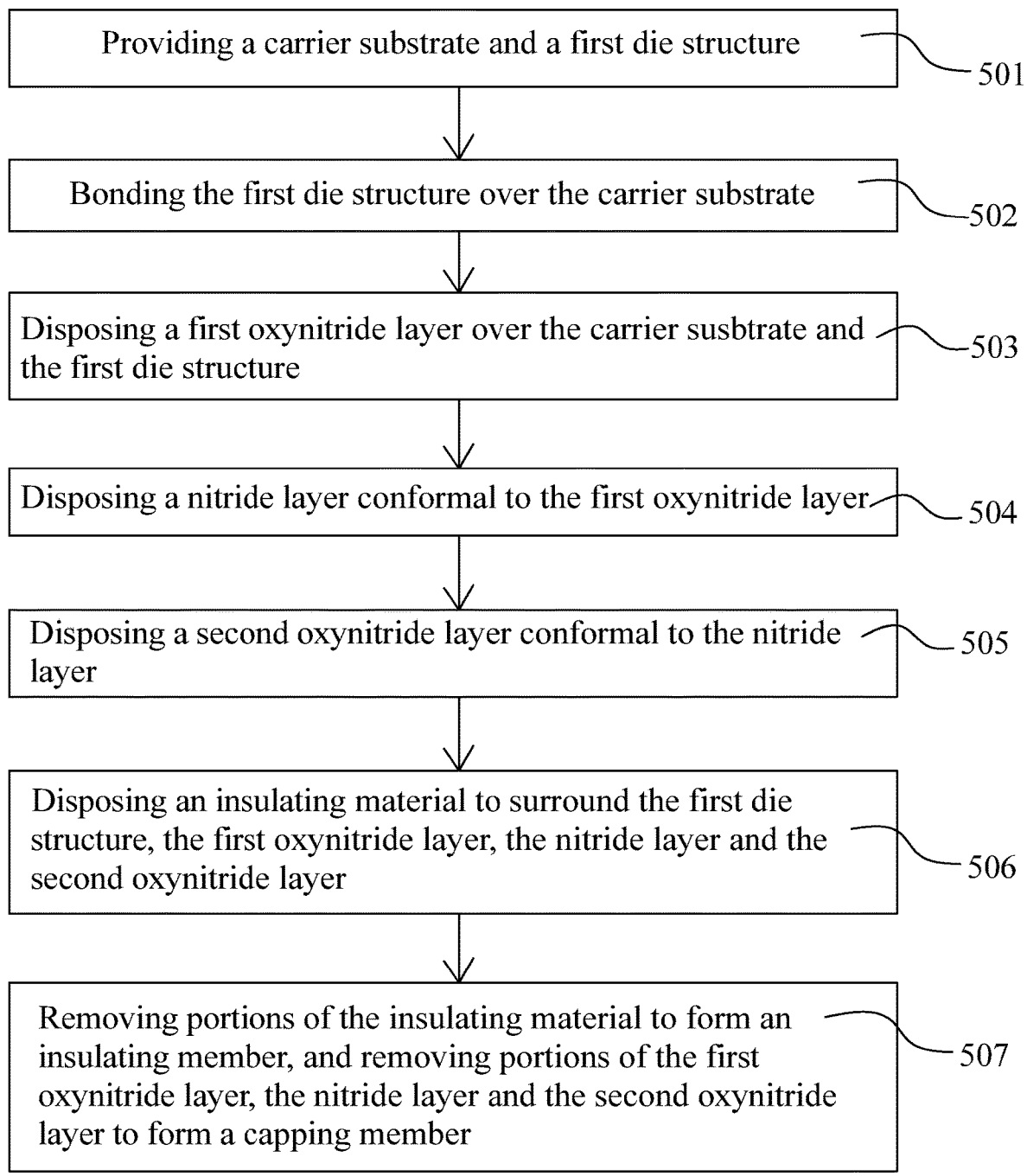
FIG. 8 is a flow diagram of a method of manufacturing a semiconductor structure in accordance with some embodiments of the present disclosure.

In the present disclosure, a method of manufacturing a semiconductor structure (100, 200, 300 or 400) is also disclosed. In some embodiments, the semiconductor structure (100, 200, 300 or 400) is formed by a method 500. The method 500 includes a number of operations and the description and illustration are not deemed as a limitation as the sequence of the operations. FIG. 8 is an embodiment of the method 500 of manufacturing the semiconductor structure (100, 200, 300 or 400). The method 500 includes a number of operations (501, 502, 503, 504, 505, 506 and 507).

Figure 9:
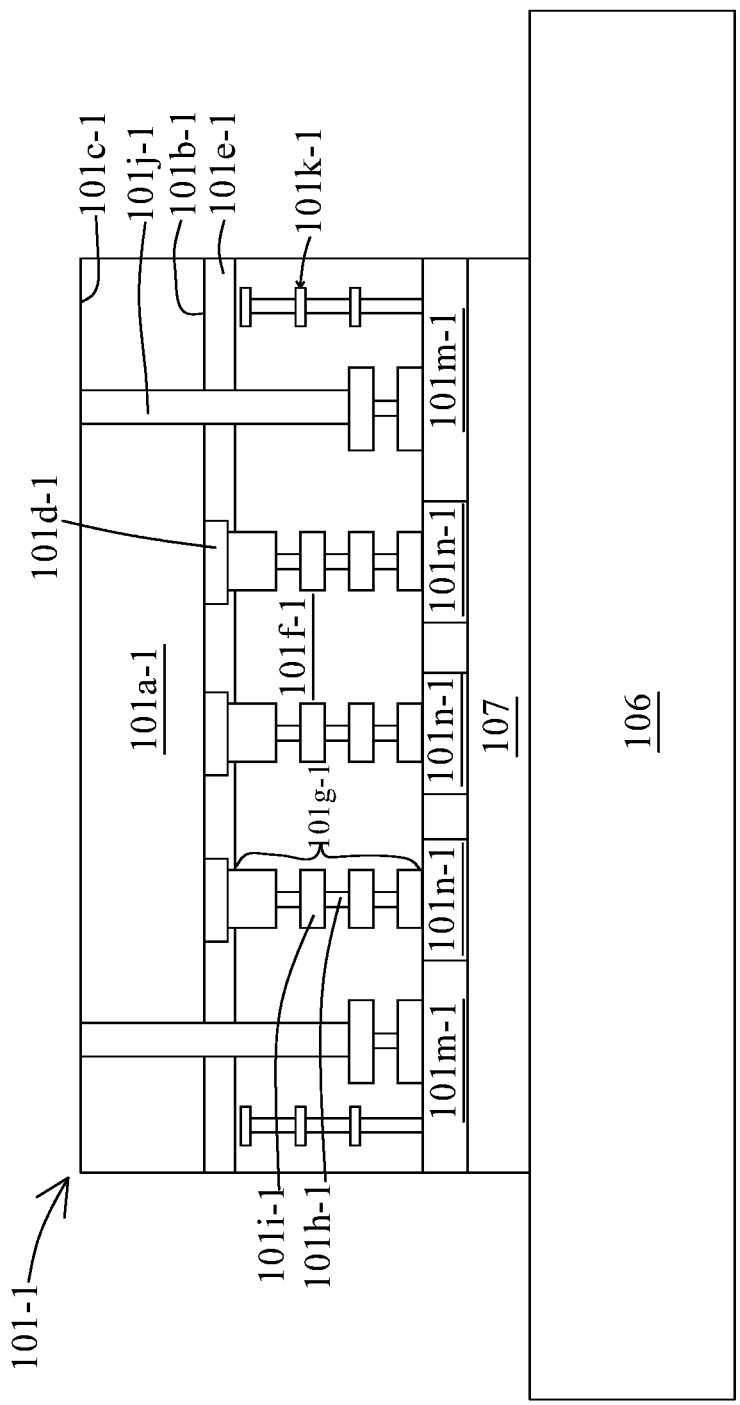
FIGS. 9 to 21 are cross-sectional views of one or more stages of the method of manufacturing a semiconductor structure in accordance with some embodiments of the present disclosure.

In operation 501, a carrier substrate 106 and a first die structure 101-1 are provided as shown in FIG. 9. The carrier substrate 106 is configured to temporarily support a substrate or device thereon. The carrier substrate 106 is a blank glass, ceramic, silicon or the like. The first die structure 101-1 has similar configurations as the die structure 101 illustrated in any one of FIGS. 1 to 5, except the conductive bump 101p are absent at this stage.

In operation 502, the first die structure 101-1 is bonded over the carrier substrate 106 as shown in FIG. 9. The first die structure 101-1 is bonded with the carrier substrate 106 by a polymeric film 107 disposed between the second dielectric 101m-1 of the first die structure 101-1 and the carrier substrate 106. The polymeric film 107 is a release film, die attach film (DAF), adhesive or the like.

Figure 10:
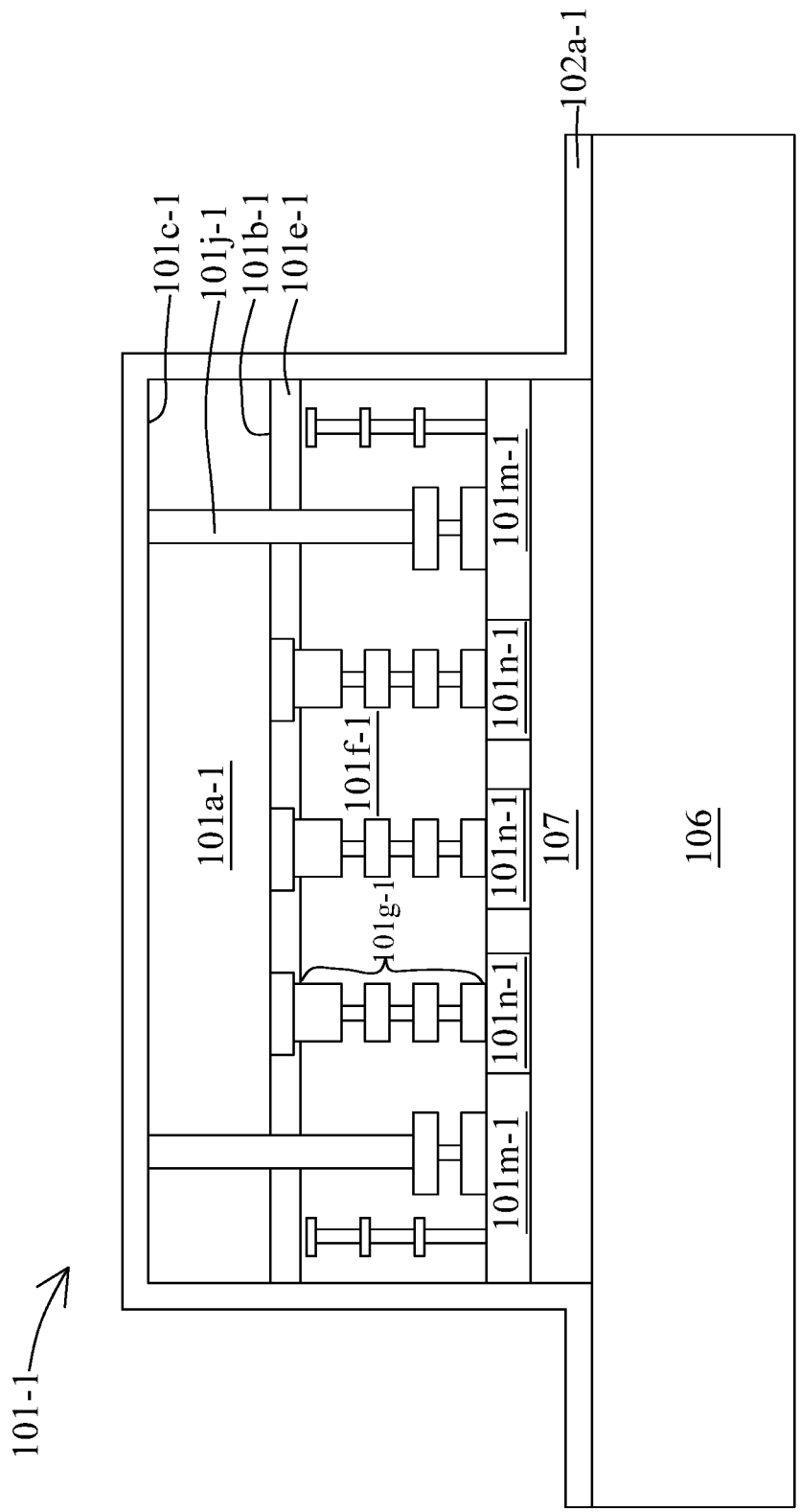

In operation 503, a first oxynitride layer 102a-1 is disposed over the carrier substrate 106 and the first die structure 101-1 as shown in FIG. 10. The first oxynitride layer 102a-1 is disposed by deposition, chemical vapor deposition (CVD) or any other suitable operations. The first oxynitride layer 102a-1 covers the entire die structure 101-1. The first oxynitride layer 102a-1 is in contact with the second surface 101c-1 of the substrate 101a-1, the first dielectric 101f-1, the second dielectric 101m-1 of the first die structure 101-1, and the polymeric film 107. The first oxynitride layer 102a-1 includes more than 5% of oxygen. The first oxynitride layer 102a-1 includes silicon oxynitride. In some embodiments, a thickness of the first oxynitride layer 102a-1 is about 50 nm. In some embodiments, the thickness of the first oxynitride layer 102a-1 is about 50 nm to about 80 nm.

Figure 11:
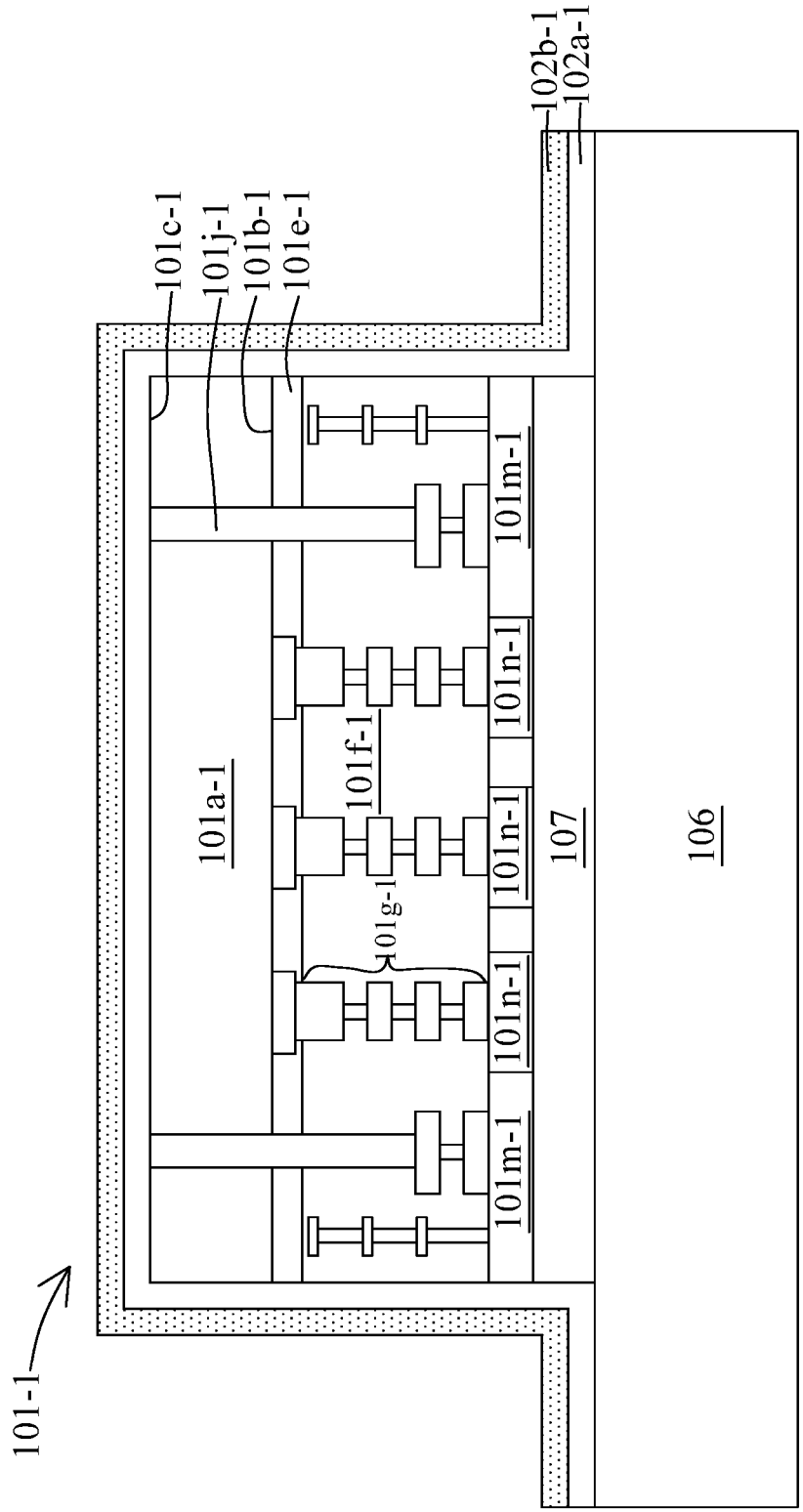

In operation 504, a nitride layer 102b-1 is disposed conformal to the first oxynitride layer 102a-1 as shown in FIG. 11. The nitride layer 102b-1 is disposed by deposition, CVD or any other suitable operations. The nitride layer 102b-1 covers the entire first oxynitride layer 102a-1. The nitride layer 102b-1 does not include oxygen. The nitride layer 102b-1 includes silicon nitride or the like. In some embodiments, an oxygen content of the first oxynitride layer 102a-1 is substantially greater than an oxygen content of the nitride layer 102b-1. In some embodiments, a thickness of the nitride layer 102h-1 is substantially greater than the thickness of the first oxynitride layer 102a-1. In some embodiments, the thickness of the nitride layer 102b-1 is about 75 nm. In some embodiments, the thickness of the nitride layer 102b-1 is about 50 nm to about 80 nm.

Figure 12:
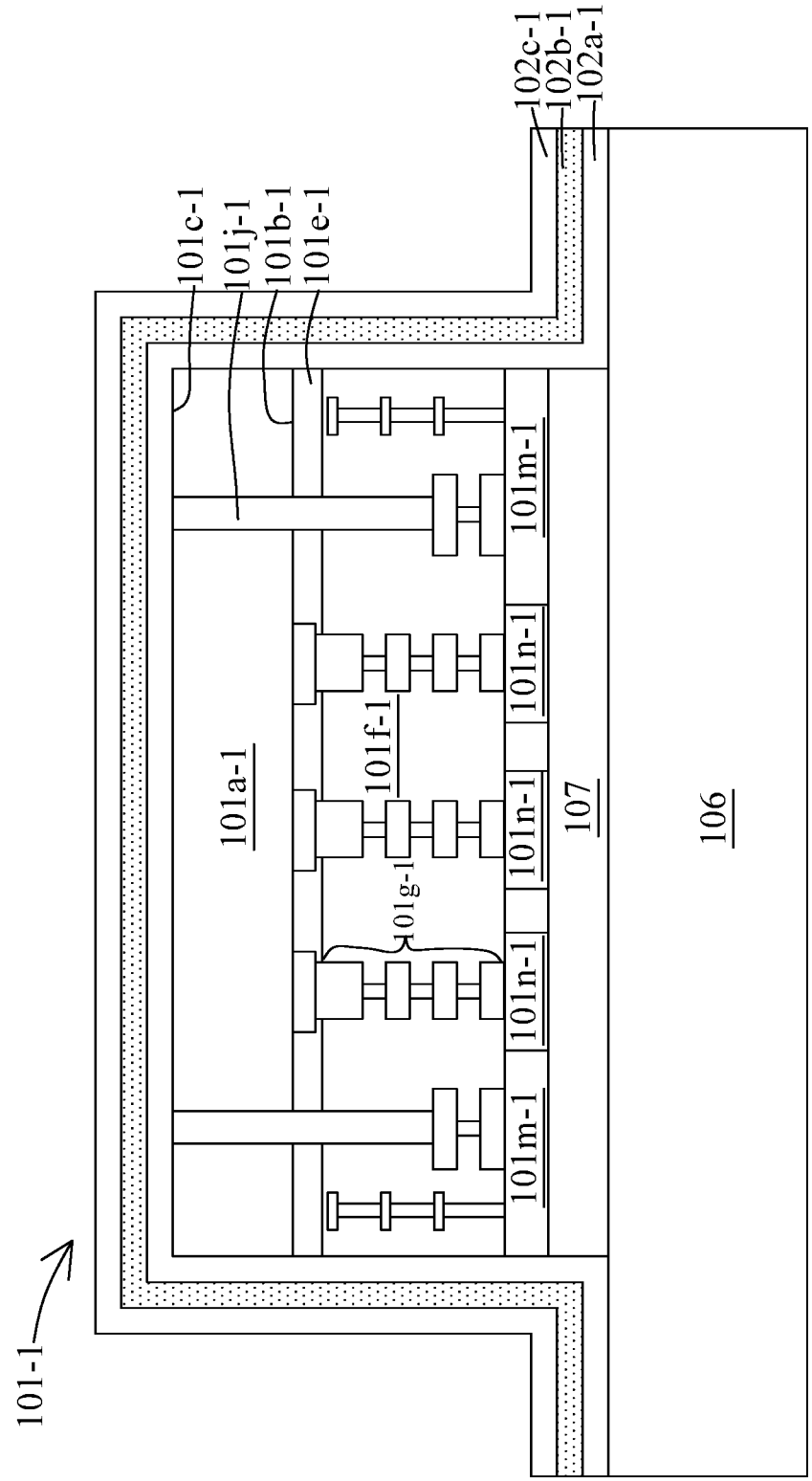

In operation 505, a second oxynitride layer 102c-1 is disposed conformal to the nitride layer 102b-1 as shown in FIG. 12. The second oxynitride layer 102c-1 is disposed by deposition, CVD or any other suitable operations. The second oxynitride layer 102c-1 has similar configurations as the first oxynitride layer 102a-1.

Figure 13:
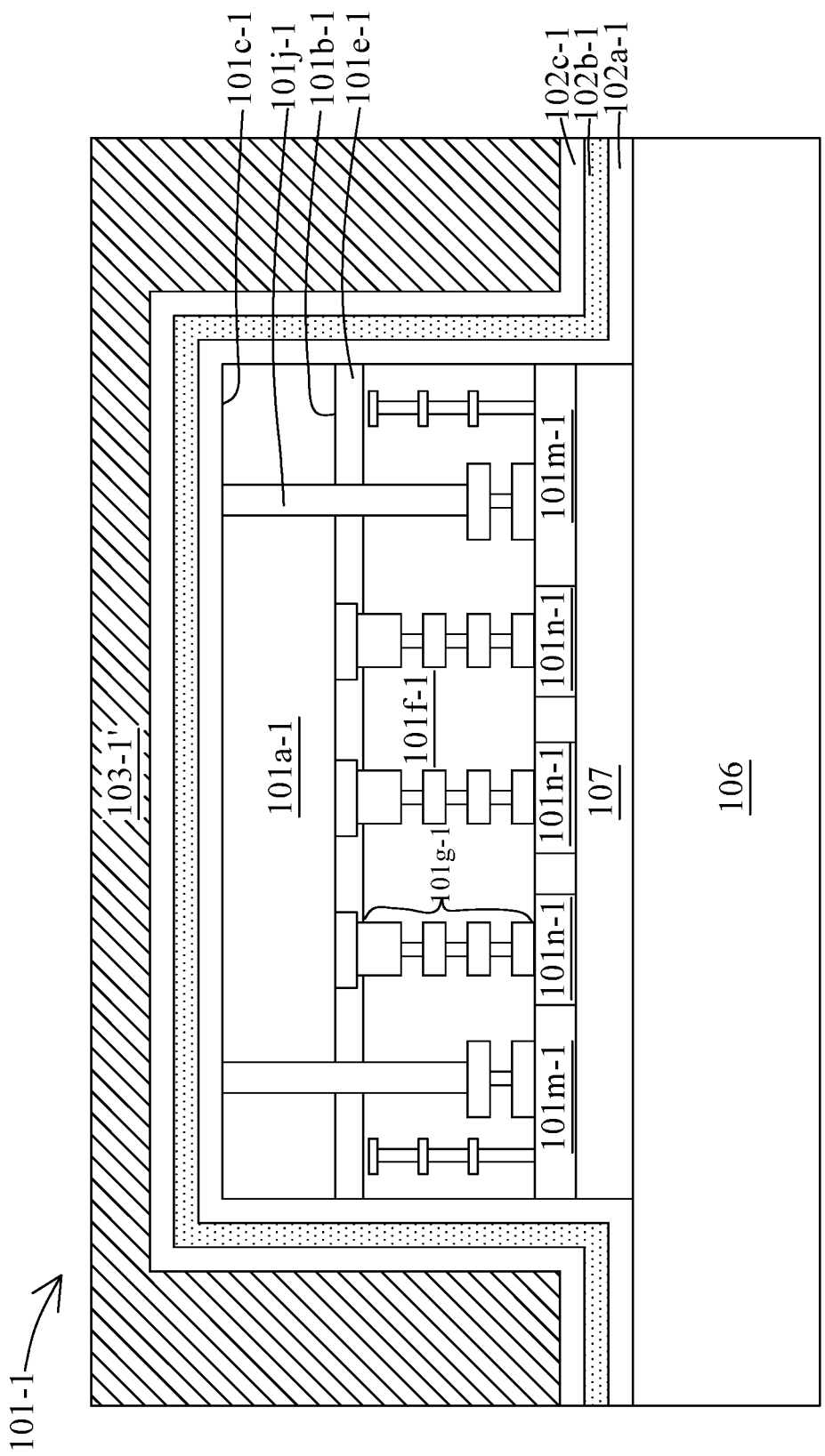

In operation 506, an insulating material 103-1' is disposed over the carrier substrate 106, the first die structure 101-1, the first oxynitride layer 102a-1, the nitride layer 102b-1, and the second oxynitride layer 102c-1 as shown in FIG. 13. The insulating material 103-1' is disposed by deposition. CVD or any other suitable operations. The insulating material 103-1' includes oxide, silicon oxide or the like. In some embodiments, an oxygen content of the insulating material 103-1' is substantially greater than the oxygen content of the first oxynitride layer 102a-1. The oxygen content of the insulating material 103-1' is substantially greater than the oxygen content of the nitride layer 102b-1. In some embodiments, an oxygen content of the insulating material 103-1' is substantially greater than the oxygen content of the second oxynitride layer 102b-1.

Figure 14:
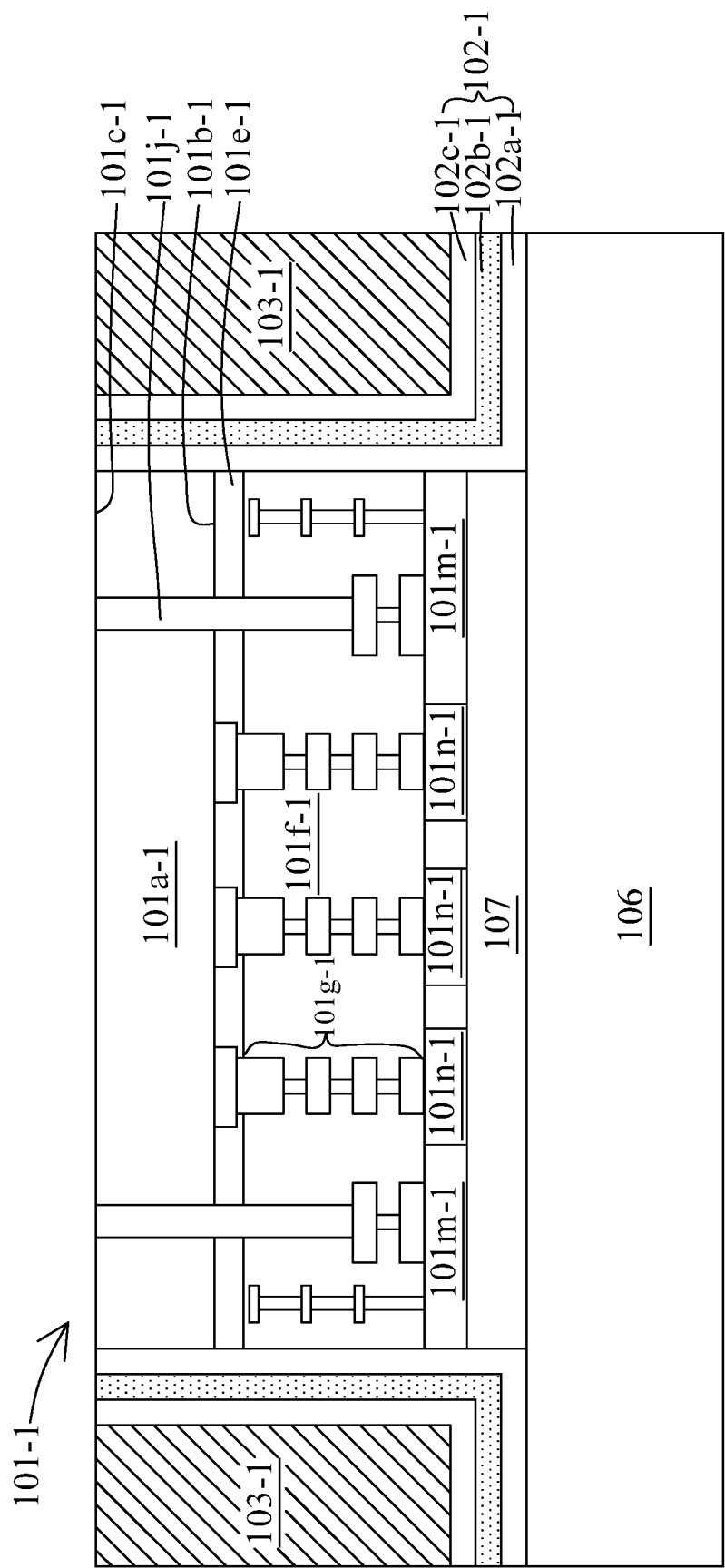

In operation 507, portions of the insulating material 103-1', portions of the first oxynitride layer 102a-1, the nitride layer 102b-1, and the second oxynitride layer 102c-1 are removed, thereby forming a first insulating member 103-1 and a first capping member 102-1 as shown in FIG. 14. In some embodiments, portions of the insulating material 103-1' and portions of the first oxynitride layer 102a-1, the nitride layer 102b-1 and the second oxynitride layer 102c-1 are removed by etching, planarization, chemical mechanical polishing (CMP) or any other suitable operations. In some embodiments, portions of the insulating material 103-1' and portions of the first oxynitride layer 102a-1, the nitride layer 102b-1 and the second oxynitride layer 102c-1 are removed until the second surface 101c-1 of the substrate 101a-1 is exposed.

Figure 15:
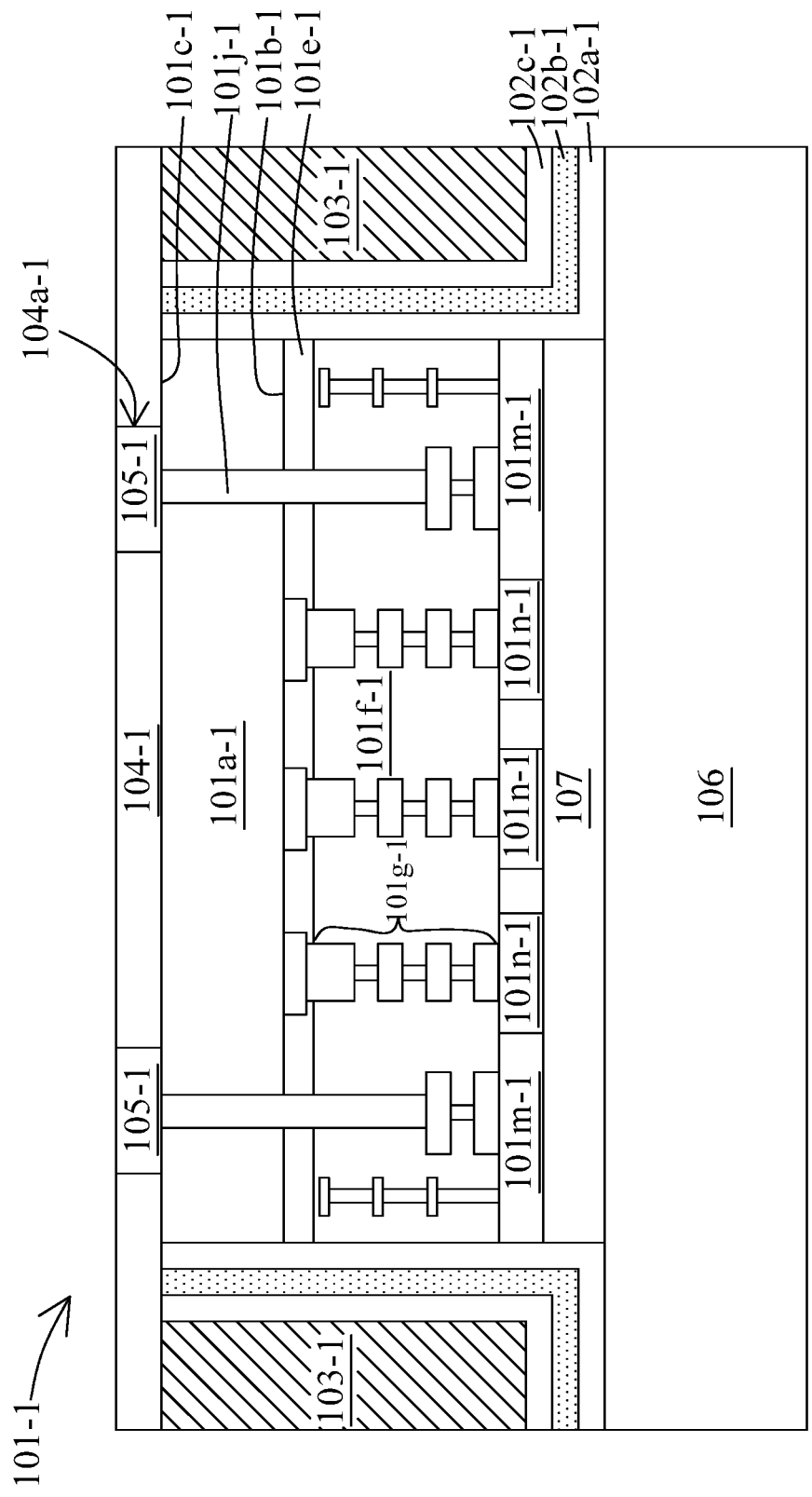

In some embodiments, after the operation 507, the following operations are implemented. In some embodiments, a first bonding dielectric 104-1 and a first bonding pad 105-1 are formed over the first die structure 101-1, the first capping member 102-1 and the first insulating member 103-1 as shown in FIG. 15. The first bonding dielectric 104-1 is formed by disposing a bonding dielectric material over the first die structure 101-1, the first capping member 102-1, and the first insulating member 103-1 by deposition, CVD or any other suitable operations, and then removing portions of the bonding dielectric material by etching or any other suitable operations, thereby forming an opening 104a-1 extending through the bonding dielectric material. The first bonding pad 105-1 is formed by disposing conductive material into the opening 104a-1 by electroplating, sputtering, deposition or any other suitable operations. The first bonding dielectric 104-1 and the first bonding pad 105-1 have similar configurations as the bonding dielectric 104 and the bonding pad 105 respectively illustrated in FIG. 5.

Figure 16:
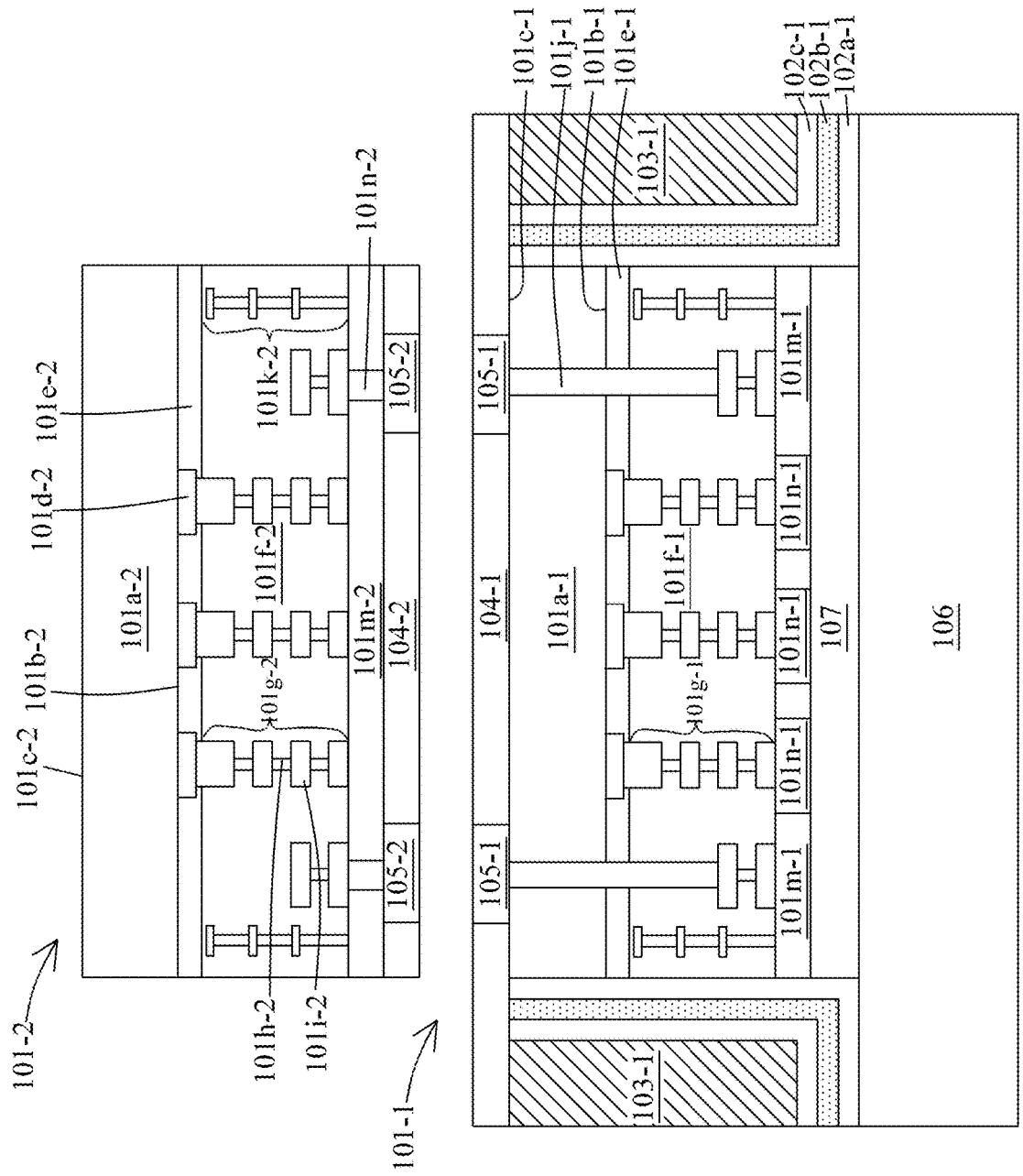
Figure 17:
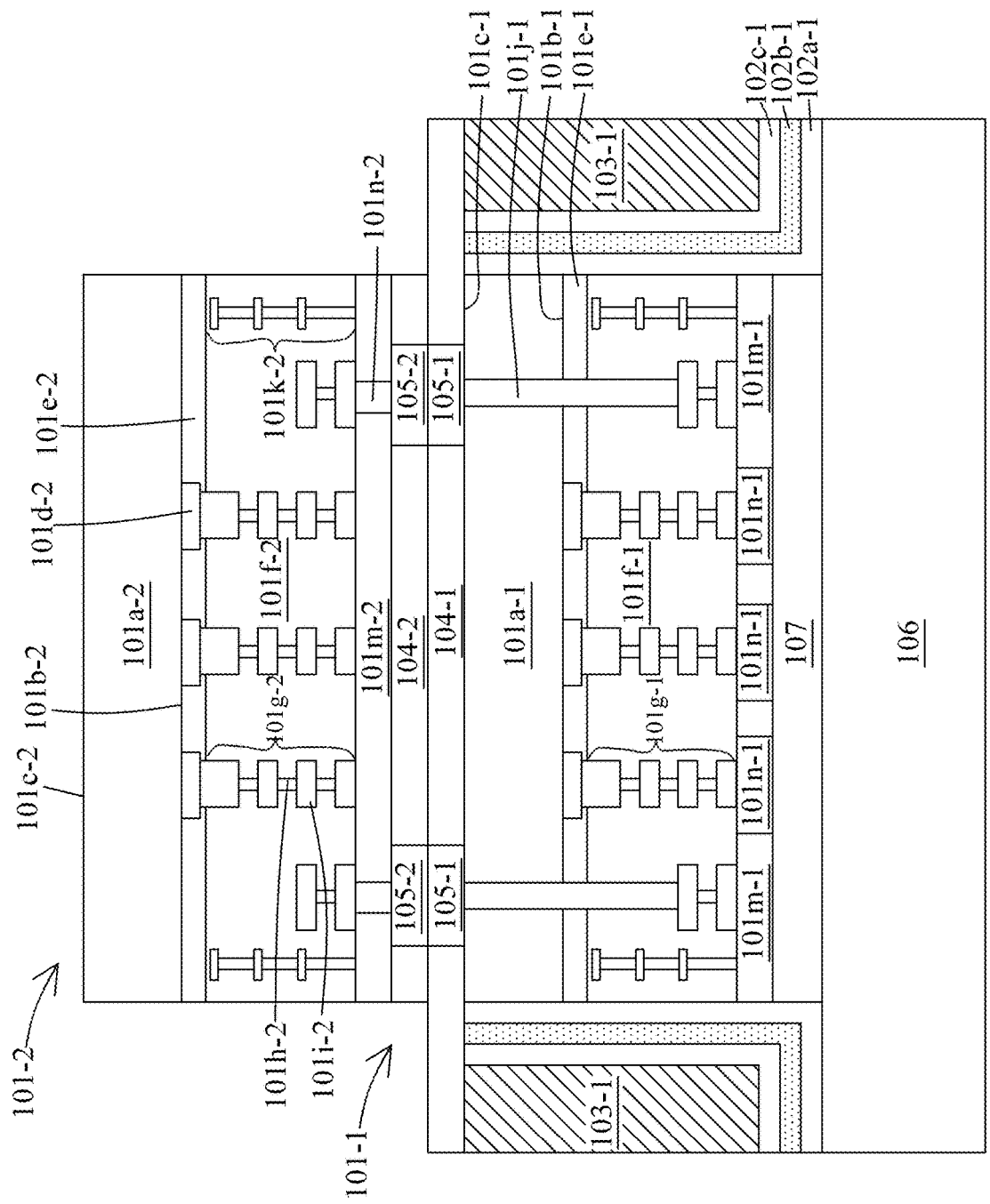

In some embodiments, a second die structure 101-2 is provided as shown in FIG. 16. The second die structure 101-2 has similar configuration as the die structure 101 illustrated in FIG. 6. After the provision of the second die structure 101-2, the second die structure 101-2 is bonded over the first die structure 101-1, the first capping member 102-1 and the first insulating member 103-1 as shown in FIG. 17. The second die structure 101-2 is bonded with the first die structure 101-1 by bonding the first bonding dielectric 104-1 with a second bonding dielectric 104-2 and bonding the first bonding pad 105-1 with a second bonding pad 105-2. The second die structure 101-2 is bonded with the first die structure 101-1 by hybrid bonding or any other suitable operations. In some embodiments, a portion of the first bonding dielectric 104-1 is exposed after the bonding of the first die structure 101-1 with the second die structure 101-2.

Figure 18:
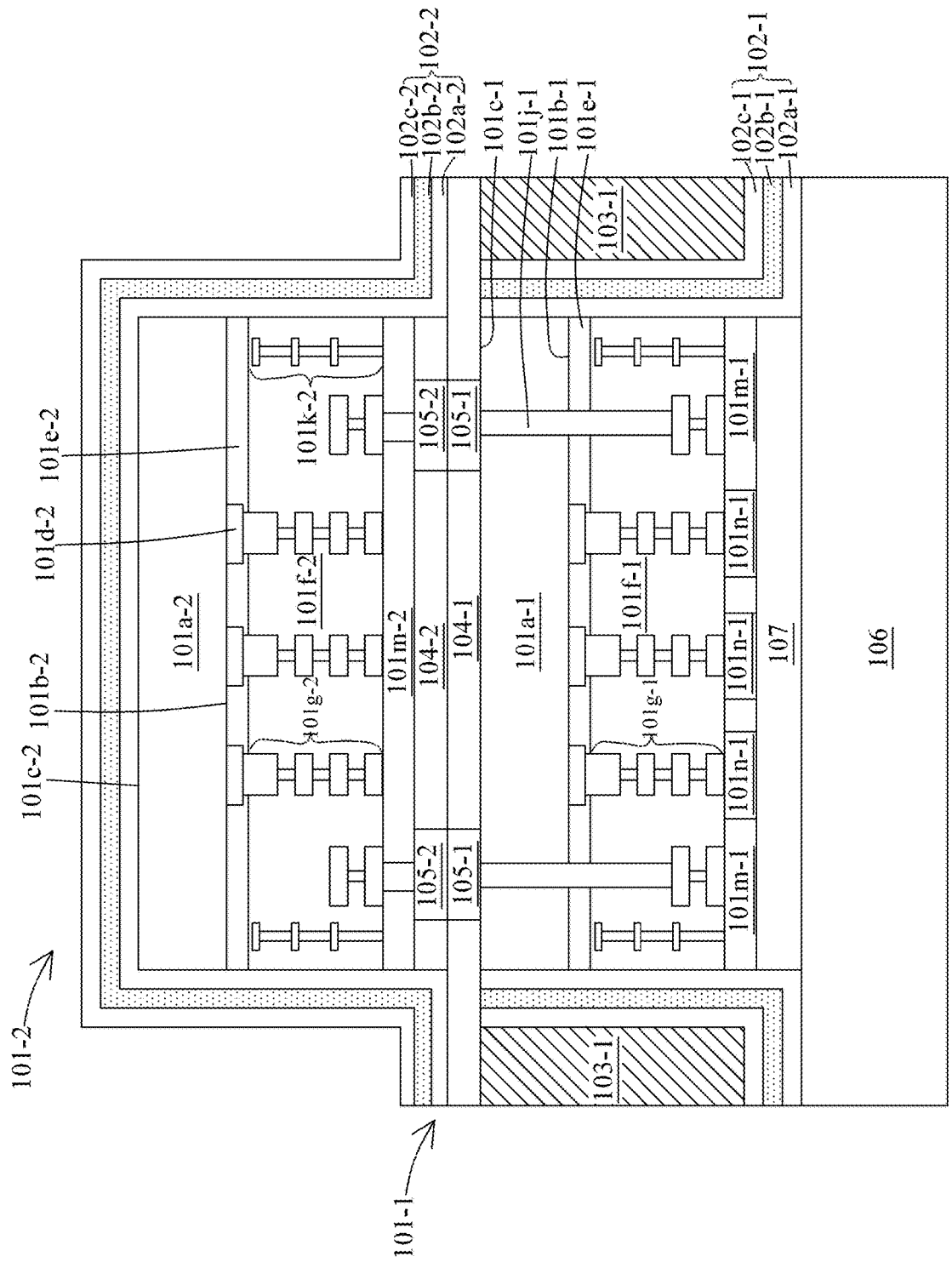

After the bonding of the first die structure 101-1 with the second die structure 101-2, the first oxynitride layer 102a-2, the nitride layer 102b-2, and the second oxynitride layer 102c-2 are sequentially disposed in a manner similar to the operations 503 to 505 to form a second capping member 102-2 as shown in FIG. 18. The second capping member 102-2 covers the entire second die structure 101-2. The second capping member 102-2 is in contact with the portion of the first bonding dielectric 104-1 exposed through the second bonding dielectric 104-2. In some embodiments, a first oxynitride layer 102a-2, a nitride layer 102b-2, and a second oxynitride layer 102a-2 of the second capping member 102-2 are sequentially disposed over the second die structure 101-2.

Figure 19:
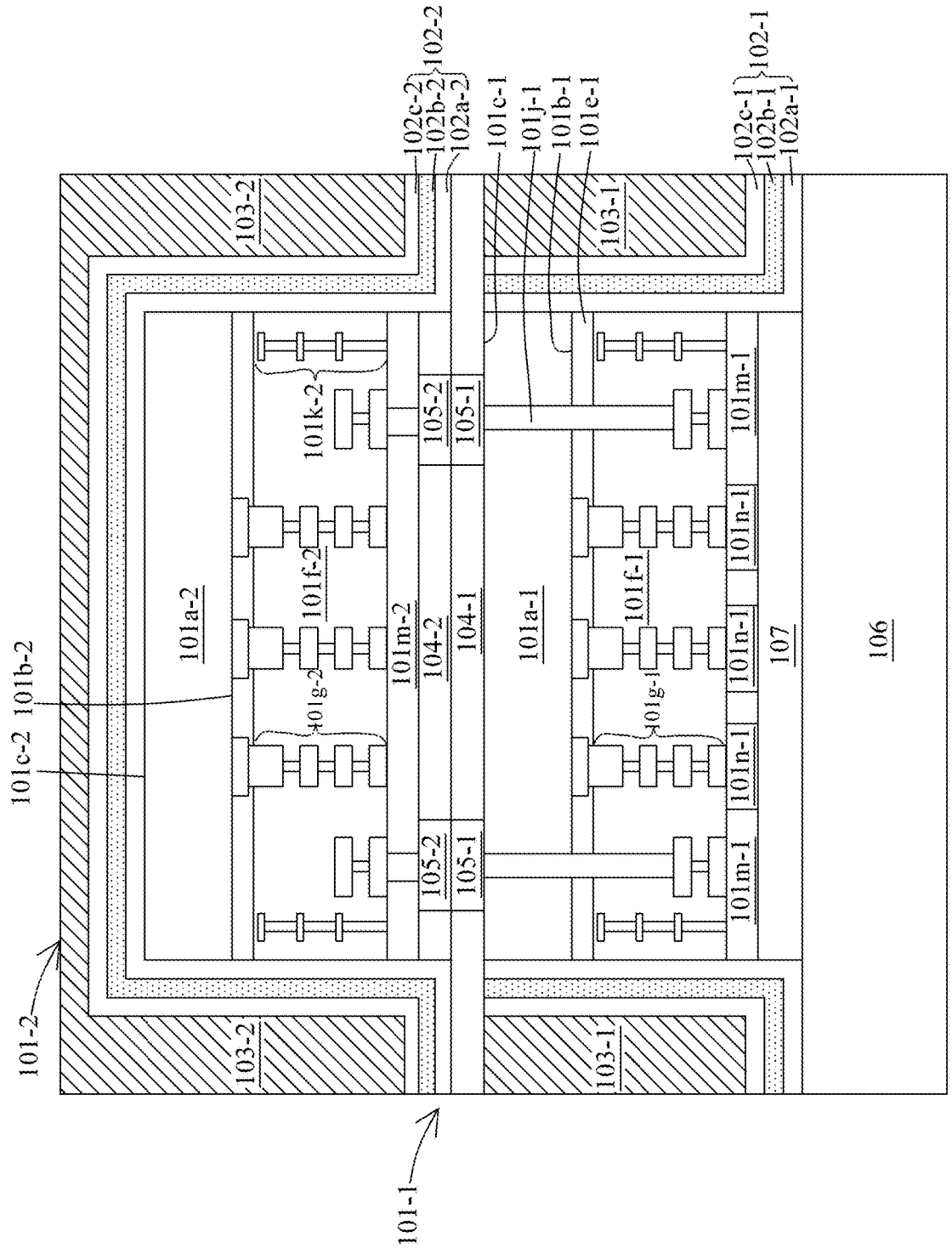

After the formation of the second capping member 102-2, a second insulating member 103-2 is formed as shown in FIG. 19. The second insulating member 103-2 is formed in a manner similar to the operation 506. The second insulating member 103-2 is formed by disposing an insulating material to surround and over the second capping member 102-2.

Figure 20:
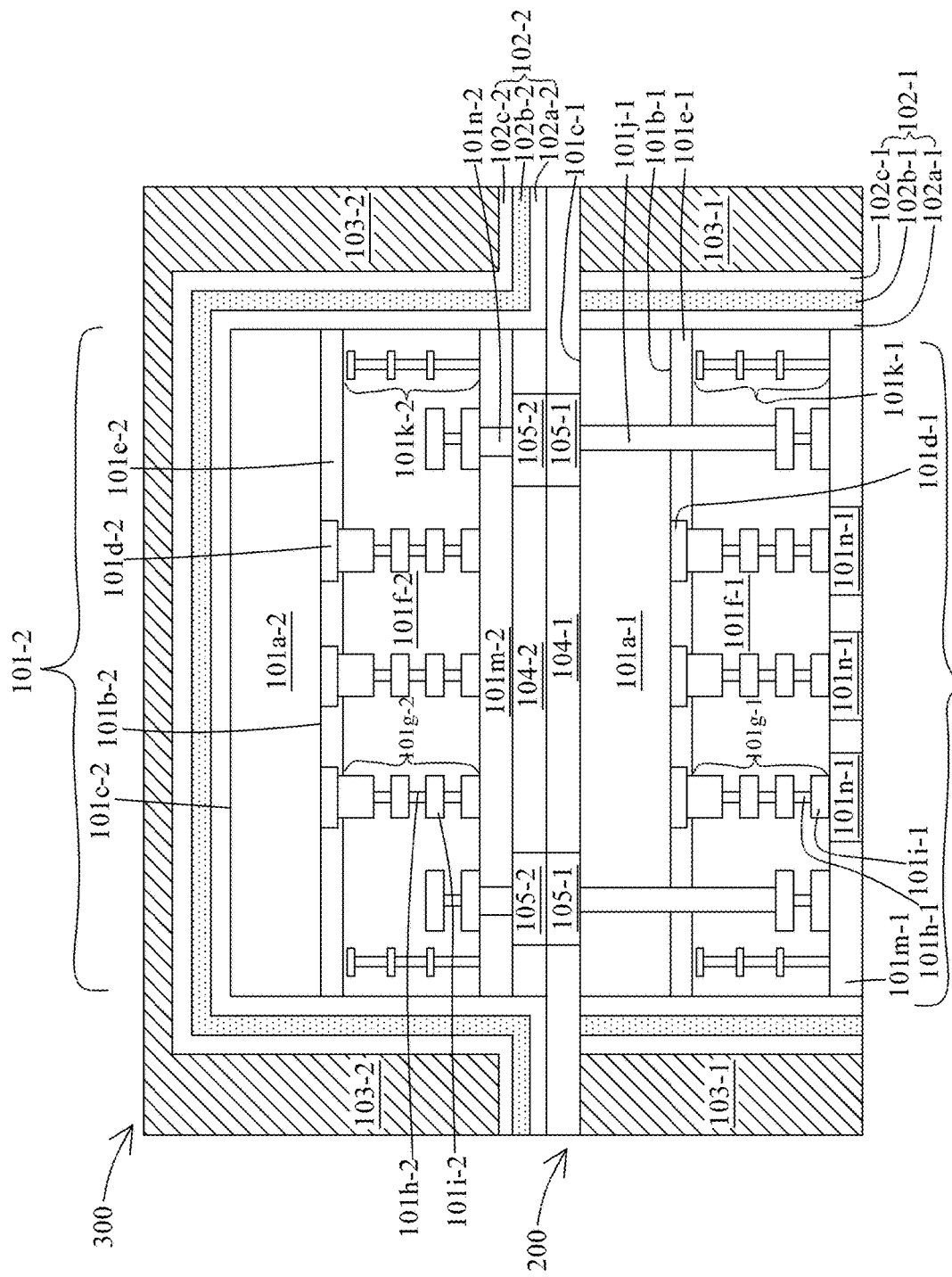

After the formation of the second insulating member 103-2, the carrier substrate 106 is removed as shown in FIG. 20. The carrier substrate 106 is debonded from the first die structure 101-1, the first capping member 102-1, and the first insulating member 103-1. The carrier substrate 106 is detached from the first die structure 101-1, the first capping member 102-1, and the first insulating member 103-1 by irradiating the polymeric film 107 with a predetermined electromagnetic radiation such as UV light.

Figure 21:
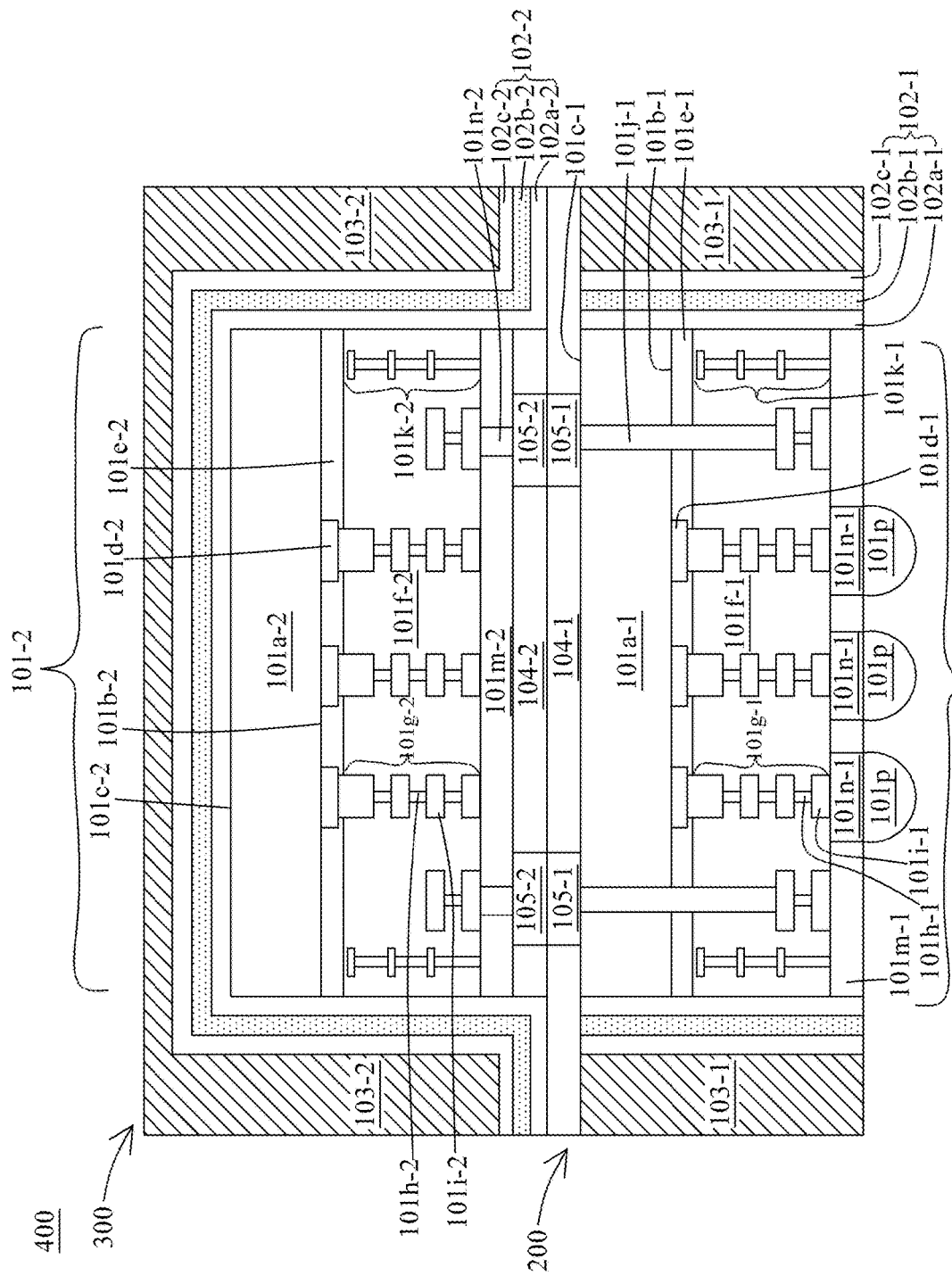

After the detachment of the carrier substrate 106, the polymeric film 107, portions of the first capping member 102-1 and portions of the first insulating member 103-1 are removed to expose the conductive pad 101n-1 as shown in FIG. 20. The polymeric film 107, portions of the first capping member 102-1 and portions of the first insulating member 103-1 are removed by planarization, etching, CMP or any other suitable operations. In some embodiments, a conductive bump 101p is then disposed on the conductive pad 101n-1 as shown in FIG. 21. The conductive bump 101p is disposed by electroplating, solder pasting, ball placement or any other suitable operations. The fourth semiconductor structure 400 as shown in FIG. 7 is formed as shown in FIG. 21.

One aspect of this disclosure relates to a semiconductor structure. The semiconductor structure includes a die structure including: a substrate; a first dielectric disposed over the substrate; a first interconnect structure disposed within the first dielectric; a second dielectric disposed on the first dielectric; and a conductive pad surrounded by the second dielectric, a capping member surrounding the die structure; and an insulating member surrounding the capping member, wherein the capping member includes a first oxynitride layer in contact with the die structure or the insulating member.

In some embodiments, the capping member includes a nitride layer between the insulating member and the first oxynitride layer or between the die structure and the first oxynitride layer. In some embodiments, an oxygen content of the insulating member is substantially greater than an oxygen content of the first oxynitride layer. In some embodiments, the capping member includes a second oxynitride layer between the nitride layer and the insulating member. In some embodiments, an oxygen content of the insulating member is substantially greater than an oxygen content of the second oxynitride layer. In some embodiments, the capping member includes a second oxynitride layer between the nitride layer and the die structure.

In some embodiments, an oxygen content of the insulating member is substantially greater than an oxygen content of the second oxynitride layer. In some embodiments, the semiconductor structure further includes a bonding dielectric disposed on the substrate of the die structure, the capping member, and the insulating member; and a bonding pad disposed on the substrate of the die structure and surrounded by the bonding dielectric. In some embodiments, the second dielectric is exposed through the capping member and the insulating member. In some embodiments, a conductive bump is disposed on the conductive pad and is protruded from the second dielectric.

One aspect of this disclosure relates to a semiconductor structure. The semiconductor structure includes a first die structure including: a first substrate; a first dielectric disposed over the first substrate; a first interconnect structure disposed within the first dielectric; a second dielectric disposed on the first dielectric; a second interconnect structure surrounded by the second dielectric; a first bonding dielectric disposed on the second dielectric; and a first bonding pad surrounded by the first bonding dielectric, a first capping member covering the entire first die structure; and a first insulating member covering the entire first capping member, wherein the first capping member includes a first oxynitride layer in contact with the first die structure or the first insulating member.

In some embodiments, the first capping member includes a first nitride layer between the first insulating member and the first oxynitride layer or between the first die structure and the first oxynitride layer. In some embodiments, an oxygen content of the first insulating member is substantially greater than an oxygen content of the first oxynitride layer.

In some embodiments, the semiconductor structure further includes a second die structure including: a second substrate; a third dielectric disposed over the second substrate; a third interconnect structure disposed within the third dielectric; a fourth dielectric disposed on the third dielectric; and a conductive pad surrounded by the fourth dielectric, a second capping member surrounding the second die structure; a second insulating member surrounding the second capping member; a second bonding dielectric disposed on the second substrate; the second capping member and the second insulating member; and a second bonding pad disposed on the second substrate and surrounded by the second bonding dielectric, wherein the second capping member includes a second oxynitride layer in contact with the second die structure or the second insulating member.

In some embodiments, the first capping member is in contact with the second bonding dielectric. In some embodiments, the first bonding dielectric in contact with the second bonding dielectric, and the first bonding pad is in contact with the second bonding pad. In some embodiments, at least a portion of the first capping member is disposed between the first insulating member and the second insulating member. In some embodiments, the first oxynitride layer is in contact with the second bonding dielectric.

An aspect of this disclosure relates to a method of manufacturing a semiconductor structure. The method includes providing a carrier substrate; disposing a die structure including a substrate on the carrier substrate; disposing an oxynitride layer covering the die structure; disposing an insulating material covering the oxynitride layer; and removing portions of the oxynitride layer and the insulating material, thereby exposing the substrate, forming a capping member from the oxynitride layer, and forming an insulating member from the insulating material, wherein the capping member surrounds the die structure, and the insulating member surrounds the capping member.

In some embodiments, the method further includes disposing a bonding dielectric on the substrate, the capping member and the insulating member after the removal of the portions of the oxynitride layer and the insulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a die structure including:
        a substrate;
        a first dielectric disposed over the substrate;
        a first interconnect structure disposed within the first dielectric;
        a second dielectric disposed on the first dielectric; and
        a conductive pad surrounded by the second dielectric,
    a capping member surrounding the die structure; and
    an insulating member surrounding the capping member,
    wherein the capping member includes a first silicon oxynitride layer in contact with the die structure, a second silicon oxynitride layer in contact with the insulating member, and a silicon nitride layer between the first and second silicon oxynitride layers, and
    each of the first silicon oxynitride layer, the second silicon oxynitride layer and the silicon nitride layer includes an end surface coplanar with a bottom surface of the second dielectric.

2. The semiconductor structure of claim 1, wherein an oxygen content and a nitride content in the first silicon oxynitride layer are substantially the same.

3. The semiconductor structure of claim 1, wherein an oxygen content of the insulating member is substantially greater than an oxygen content of the first silicon oxynitride layer.

4. The semiconductor structure of claim 1, wherein the insulating member has an end surface coplanar with the bottom surface of the second dielectric.

5. The semiconductor structure of claim 1, wherein an oxygen content of the insulating member is substantially greater than an oxygen content of the second silicon oxynitride layer.

6. The semiconductor structure of claim 1, wherein the conductive pad includes a bottom surface coplanar with the bottom surface of the second dielectric.

7. The semiconductor structure of claim 6, wherein the die structure further comprises a seal ring extending vertically within the first dielectric and surrounding the first interconnect structure.

8. The semiconductor structure of claim 1, further comprising:
    a bonding dielectric disposed on the substrate of the die structure, the capping member, and the insulating member; and
    a bonding pad disposed on the substrate of the die structure and surrounded by the bonding dielectric.

9. The semiconductor structure of claim 1, wherein the second dielectric is exposed through the capping member and the insulating member.

10. The semiconductor structure of claim 1, wherein a conductive bump is disposed on the conductive pad and is protruded from the second dielectric.

11. A semiconductor structure, comprising:
a first die structure including:
  a first substrate;
  a first dielectric disposed over the first substrate;
  a first interconnect structure disposed within the first dielectric;
  a second dielectric disposed on the first dielectric;
  a second interconnect structure surrounded by the second dielectric;
  a first bonding dielectric disposed on the second dielectric; and
  a first bonding pad surrounded by the first bonding dielectric,
a first capping member covering the entire first die structure; and
a first insulating member covering the entire first capping member,
wherein the first capping member includes a first silicon oxynitride layer in contact with the first die structure, a second silicon oxynitride layer surrounding the first oxynitride layer, and a silicon nitride layer between the first and second silicon oxynitride layers, and the first silicon oxynitride layer includes a lateral portion having an end surface coplanar with a bottom surface of the first bonding pad exposed through the first bonding dielectric.

12. The semiconductor structure of claim 11, wherein a top surface of the first bonding pad exposed through the first bonding dielectric is substantially coplanar with a top surface of the first bonding dielectric.

13. The semiconductor structure of claim 11, wherein an oxygen content of the first insulating member is substantially greater than an oxygen content of the first silicon oxynitride layer.

14. The semiconductor structure of claim 11, further comprising:
a second die structure including:
  a second substrate;
  a third dielectric disposed over the second substrate;
  a third interconnect structure disposed within the third dielectric;
  a fourth dielectric disposed on the third dielectric; and
  a conductive pad surrounded by the fourth dielectric,
a second capping member surrounding the second die structure;
a second insulating member surrounding the second capping member;
a second bonding dielectric disposed on the second substrate, the second capping member and the second insulating member; and
a second bonding pad disposed on the second substrate and surrounded by the second bonding dielectric,
wherein the second capping member includes a second silicon oxynitride layer in contact with the second die structure or the second insulating member.

15. The semiconductor structure of claim 14, wherein the first capping member is in contact with the second bonding dielectric.

16. The semiconductor structure of claim 14, wherein the first bonding dielectric is in contact with the second bonding dielectric, and the first bonding pad is in contact with the second bonding pad, and a contact interface between the first and second bonding pads is coplanar with a contact interface between the first and second bonding dielectrics.

17. The semiconductor structure of claim 14, wherein at least a portion of the first capping member is disposed between the first insulating member and the second insulating member.

18. The semiconductor structure of claim 11, wherein the first insulating member covers an entire capping member.

19. A semiconductor structure, comprising:
a die structure including a substrate, a dielectric disposed at a surface of the substrate, and an interconnect structure disposed within the dielectric;
a capping member surrounding the die structure and including a first silicon oxynitride layer, a second silicon oxynitride layer and a silicon nitride layer between the first and second silicon oxynitride layers; and
an insulating member surrounding the capping member,
wherein the first silicon oxynitride layer is in contact with the die structure, and the second silicon oxynitride layer is in contact with the insulating member, and
wherein a thickness of the silicon nitride layer is substantially greater than a thickness of the first silicon oxynitride layer.

20. The semiconductor structure of claim 19, wherein a thickness of the first silicon oxynitride layer is substantially equal to a thickness of the second silicon oxynitride layer.

* * * * *